United States Patent
Guntermann et al.

(10) Patent No.: US 10,671,192 B2
(45) Date of Patent: *Jun. 2, 2020

(54) PROCESS FOR THE PRODUCTION OF A LAYERED BODY AND LAYERED BODIES OBTAINABLE THEREFROM

(75) Inventors: Udo Guntermann, Krefeld (DE); Detlef Gaiser, Köln (DE); Myriam Grasse, Leverkusen (DE); Akio Ishikawa, Tokyo (JP)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 258 days.

This patent is subject to a terminal disclaimer.

(21) Appl. No.: 14/131,614

(22) PCT Filed: Jul. 6, 2012

(86) PCT No.: PCT/EP2012/002840
§ 371 (c)(1),
(2), (4) Date: May 15, 2014

(87) PCT Pub. No.: WO2013/007362
PCT Pub. Date: Jan. 17, 2013

(65) Prior Publication Data
US 2014/0313433 A1    Oct. 23, 2014

Related U.S. Application Data

(60) Provisional application No. 61/657,121, filed on Jun. 8, 2012, provisional application No. 61/507,239, filed on Jul. 13, 2011.

(30) Foreign Application Priority Data

Jul. 8, 2011    (DE) .......................... 10 2011 107 459
May 10, 2012    (DE) .......................... 10 2012 009 175

(51) Int. Cl.
*G06F 3/041*    (2006.01)
*G03F 7/09*    (2006.01)
(Continued)

(52) U.S. Cl.
CPC .............. *G06F 3/041* (2013.01); *G03F 7/039* (2013.01); *G03F 7/093* (2013.01); *H01G 11/48* (2013.01);
(Continued)

(58) Field of Classification Search
CPC .................................................. H01L 51/0015
See application file for complete search history.

(56) References Cited

U.S. PATENT DOCUMENTS 4,187,190 A * 2/1980 McLaughlin ............ C11D 1/72
510/233
4,959,430 A    9/1990 Jonas et al.
(Continued)

FOREIGN PATENT DOCUMENTS

DE    69905860    11/2003
EP    0339340    11/1989
(Continued)

OTHER PUBLICATIONS

Orgacon, Conductive Transparent Films, Patterning Orgacon film by UV photo-lithography, pp. 1-3, Jul. 2005.*
(Continued)

*Primary Examiner* — James M Mellott
(74) *Attorney, Agent, or Firm* — Servilla Whitney LLC

(57) ABSTRACT

Described is a process for the production of a layered body S2 comprising:
i. provision of a layered body S1 comprising a substrate and an electrically conductive layer which is applied to the substrate and comprises an electrically conductive polymer P1;

(Continued)

ii. partial covering of a part of the electrically conductive layer with a covering layer D, comprising a polymer P2 contained therein, from a covering phase to obtain at least one covered region $D_d$ and at least one non-covered region $D_u$ of the electrically conductive layer;

iii. reduction of the electrical conductivity of the electrically conductive layer in at least a part of the at least one non-covered region $D_u$ compared with the electrical conductivity of the electrically conductive layer in the at least one covered region $D_d$;

iv. at least partial removal of the covering layer D by an alkaline aqueous treatment.

18 Claims, 7 Drawing Sheets

(51) Int. Cl.
*H01L 51/00* (2006.01)
*G03F 7/039* (2006.01)
*H01G 11/48* (2013.01)

(52) U.S. Cl.
CPC ...... *H01L 51/0015* (2013.01); *H01L 51/0018* (2013.01); *H01L 51/0023* (2013.01); *Y02E 60/13* (2013.01); *Y10T 428/24802* (2015.01)

(56) References Cited

U.S. PATENT DOCUMENTS

| | | | |
|---|---|---|---|
| 5,300,575 | A | 4/1994 | Jonas et al. |
| 5,869,220 | A * | 2/1999 | Hallock ............... G03F 7/033 430/281.1 |
| 5,939,242 | A * | 8/1999 | Tang ............... G03F 7/0045 430/270.1 |
| 6,943,571 | B2 | 9/2005 | Worledge |
| 2002/0077259 | A1* | 6/2002 | Skee ............... C11D 3/0073 510/175 |
| 2002/0136923 | A1 | 9/2002 | Jonas et al. |
| 2004/0211989 | A1 | 10/2004 | Armgarth et al. |
| 2005/0181299 | A1* | 8/2005 | Trefonas, III ........... G03F 7/091 430/271.1 |
| 2010/0089872 | A1 | 4/2010 | Ihara et al. |
| 2011/0024386 | A1 | 2/2011 | Nishimura et al. |
| 2012/0024816 | A1 | 2/2012 | Huang et al. |

FOREIGN PATENT DOCUMENTS

| | | |
|---|---|---|
| EP | 0440957 | 8/1991 |
| EP | 1227529 | 7/2002 |
| EP | 1054414 | 3/2003 |
| EP | 1357226 | 10/2003 |
| EP | 1 835513 | 12/2005 |
| JP | H09-293963 | 11/1997 |
| JP | 2004114407 A | 4/2004 |
| JP | 2008-007631 | 1/2008 |
| JP | 2008083200 A | 4/2008 |
| JP | 2008277022 A | 11/2008 |
| JP | 2010/161013 | 7/2010 |
| JP | 2010-202564 | 9/2010 |
| WO | WO-2003/067680 | 8/2003 |
| WO | 2004/106437 A1 | 12/2004 |
| WO | WO-2008/041461 | 4/2008 |
| WO | WO-2009/122923 | 10/2009 |

OTHER PUBLICATIONS

Orgacon, Conductive Transparent Films, Patterning Orgacon film by means of UV lithography, pp. 1-3, May 2001.*

Orgacon, Patterning Orgacon Film by screen-printing—mask based approach, p. 1, May 2001.*

Blankenburg et al., Solar Energy Materials & Solar Cells, 93, (2009), 476-483.*

Methylene Blue, Sigma-Aldrich, Mar. 2002.*

Gisjman, P. et al., Polymer Degradation and Stability, 65, 1999, pp. 433-441.*

"Orgacon Conductive Transparent Films, Application Sheet: Patterning Orgacon film by UV photo-lithography", *AGFA* Jul. 2005, 1-3.

PCT International Search Report for PCT/EP2012/002840, dated Oct. 10, 2012, 3 pages.

Groenendaal, L. "BERT" et al., "Poly(3,4-ethylenedioxythiophene) and Its Derivatives: Past, Present, and Future", *Adv. Mater. 12*, No. 7 2000, 14 pgs.

Kabanov, V. A., "Polyelectrolyte complexes in solution and in bulk", *Russian Chemical Reviews* 74(1) 2005, 3-20.

Kovaicic, Peter et al., "Polymerication of Benzene to p-Polyphenyl by Aluminum Chloride-Cupric Chloride", *J. Am. Chem. Cos. 85* 1963, 5 pgs.

Robhaupter, E. et al., *Photolacke, Chemie in userer Zeit 5*, No. 5 1971, 8 pgs.

Walker, John A. et al., "New Chemically Prepared Conducting "Pyrrole Blacks"", *Journal of Polymer Science: Part A Polymer Chemistry*, vol. 26 1988, 10 pgs.

Weyl, Houben, *Methoden der organischen Chemie*, vol. E 20 Makromolekulare Stoffe, Part 2 1987, 1141 et seq.

"Product Data Sheet AZ 111 XFS AZ 8112", 4 pgs.

Orgacon® Conductive Transparent Films Application Sheet, "Patterning Orgacon® Film by screen printing tape-peelable resist mask", Jul. 2005, 2 pages.

* cited by examiner

PROCESS FOR THE PRODUCTION OF A LAYERED BODY AND LAYERED BODIES OBTAINABLE THEREFROM

CROSS-REFERENCE TO RELATED APPLICATIONS

This application is the national stage entry of PCT/EP2012/002840, filed on Jul. 6, 2012, which claims priority to German Patent application numbers 10 2011 107 459.0, filed on Jul. 8, 2011 and 10 2012 009 175.3 filed May 10, 2012, U.S. Provisional application numbers 61/507,239 filed Jul. 13, 2011 and 61/657,121 filed Jun. 8, 2012, all of which are incorporated herein by reference in their entireties.

FIELD

The invention relates to a process for the production of a layered body, a layered body, a use of a layered body for the production of an electronic component, in particular a touch panel, a touch screen or an antistatic coating, and an electronic component, in particular a touch panel or a touch screen, comprising a layered body.

BACKGROUND

Conductive polymers are increasingly gaining economic importance, since polymers have advantages over metals with respect to processability, weight and targeted adjustment of properties by chemical modification. Examples of known π-conjugated, conductive polymers are polypyrroles, polythiophenes, polyanilines, polyacetylenes, polyphenylenes and poly(p-phenylene-vinylenes). Layers of conductive polymers are employed in diverse industrial uses, e.g. as polymeric counter-electrodes in capacitors or for throughplating of electronic circuit boards. The preparation of conductive polymers is carried out chemically or electrochemically by oxidation from monomeric precursors, such as e.g. optionally substituted thiophenes, pyrroles and anilines and the particular optionally oligomeric derivatives thereof. In particular, chemically oxidative polymerization is widely used, since it is easy to realize industrially in a liquid medium or on diverse substrates.

A particularly important polythiophene which is used industrially is poly(ethylene-3,4-dioxythiophene) (PEDOT or PEDT), which is described, for example, in EP 0 339 340 A2 and is prepared by chemical polymerization of ethylene-3,4-dioxythiophene (EDOT or EDT), and which has very high conductivities in its oxidized form. An overview of numerous poly(alkylene-3,4-dioxythiophene) derivatives, in particular poly(ethylene-3,4-dioxythiophene) derivatives, and their monomer units, syntheses and uses is given by L. Groenendaal, F. Jonas, D. Freitag, H. Pielartzik & J. R. Reynolds, Adv. Mater. 12, (2000) p. 481-494.

The dispersions, disclosed for example in EP 0 440 957 A2, of PEDOT with polyanions, such as e.g. polystyrenesulphonic acid (PSS), have acquired particular industrial importance. Transparent, conductive films which have found a large number of uses, e.g. as an antistatic coating or as a hole injection layer in organic light-emitting diodes (OLEDS), as shown in EP 1 227 529 A2, can be produced from these dispersions.

In this context, the polymerization of EDOT is carried out in an aqueous solution of the polyanion, and a polyelectrolyte complex is formed. Cationic polythiophenes which contain polymeric anions as counter-ions for charge compensation are also often called polythiophene/polyanion complexes in the technical field. Due to the polyelectrolyte properties of PEDOT as a polycation and PSS as a polyanion, this complex in this context is not a true solution, but rather a dispersion. The extent to which polymers or parts of the polymers are dissolved or dispersed in this context depends on the weight ratio of the polycation and the polyanion, on the charge density of the polymers, on the salt concentration of the environment and on the nature of the surrounding medium (V. Kabanov, Russian Chemical Reviews 74, 2005, 3-20). The transitions in this context can be fluid. No distinction is therefore made in the following between the terms "dispersed" and "dissolved". Similarly little distinction is made between "dispersing" and "solution" or between "dispersing agent" and "solvent". Rather, these terms are used as being equivalent in the following.

There is a great need for being able to structure electrically conductive layers based on conductive polymers, in particular based on complexes of polythiophenes and polyanions, similarly to ITO layers (=indium tin oxide layer), where here and in the following "structuring" is to be understood as meaning any measure which leads to an at least partial reduction, but preferably to a complete elimination of the conductivity, in a part region or in several part regions of the layer of electrically conductive polymers.

One possibility for the production of structured layers based on conductive polymers is to apply these polymers to surfaces in a structured manner via certain printing processes, as is described, for example, in EP-A-1 054 414. However, the disadvantage of this set-up for achieving the object is that the electrically conductive polymers must be converted into a paste, which sometimes causes problems in view of the tendency of conductive polymers to aggregate. Furthermore, during application of electrically conductive polymers via printing pastes there is the disadvantage that the outer region of the drops of liquid is thicker than the inner region and that accordingly on drying of the pastes the coating is thicker in the outer region than in the inner region. The resulting irregularity in the layer thickness often has an adverse effect on the electrical properties of the electrically conductive layer. A further disadvantage of structuring via printing pastes is that this is applied only in those regions in which an electrical conductivity of a substrate surface is desired. The consequence of this is that considerable differences in colour occur on the substrate surface between the regions with and without application of the printing paste, which as a rule, however, are undesirable.

In addition to the use of printing pastes, a further possibility for the production of structured coatings from conductive polymers consists of first producing a uniform, non-structured coating from electrically conductive polymers and only then structuring this, for example by photobleaching processes or by the use of etching solutions. Thus, for example, WO-A-2009/122923 and WO-A-2008/041461 describe processes in which layers of electrically conductive polymers are structured by means of cerium ammonium nitrate solutions having an etching action. JP-A-2010-161013 describes a process in which structuring of a layer of a conductive polymer is carried out by using a photoresist and/or a dry film resist in combination with an etching agent solution containing cerium ammonium nitrate, cerium ammonium sulphate or hypochlorite. However, the disadvantage of this set-up is, inter alia, that such etching solutions remove the coating of the electrically conductive polymer to a considerable extent, and because of these changes in the nature of the surface the external appearance of the coating is therefore adversely influenced. In particular, the colour of the coating is impaired decisively by a structuring with etching solutions containing cerium.

DETAILED DESCRIPTION

Figure 1:
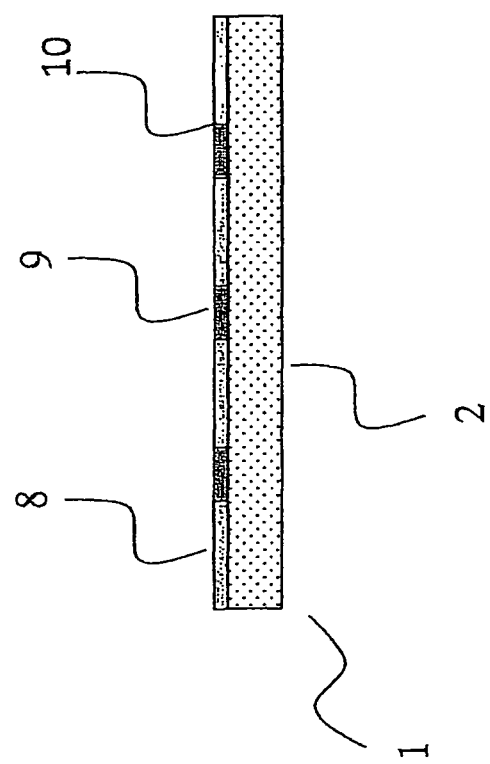
FIG. 1 shows the structure of a layered body 1 according to the invention.

The present invention was based on the object of overcoming the disadvantages resulting from the prior art in connection with the structuring of layers of electrically conductive polymers, in particular of layers comprising polythiophenes.

In particular, the present invention was based on the object of providing a process for the structuring of a layer of electrically conductive polymers, in particular a layer comprising polythiophenes, with which the conductivity can be reduced, preferably eliminated completely, in certain regions of this layer without the colour of the layer being noticeably influenced by this structuring.

The present invention was also based on the object of providing a process for the structuring of a layer of electrically conductive polymers, in particular a layer comprising polythiophenes, with which the conductivity can be reduced, preferably eliminated completely, in certain regions of this layer without the thickness of the coating and therefore the external appearance of the layer being noticeably influenced by this structuring.

The present invention was furthermore based on the object of providing a process for the structuring of a layer of electrically conductive polymers, in particular a layer comprising polythiophenes, with which the conductivity can be reduced, preferably eliminated completely, in certain regions of this layer, it being possible for clearly defined sharp transitions to be achieved between the conductive regions and the regions of reduced conductivity compared with the conductive regions.

A contribution towards achieving the abovementioned objects is made by a process for the production, preferably for the modification, particularly preferably for the structuring of a layered body S2 (1) comprising the process steps:

i) provision of a layered body S1 comprising a substrate and an electrically conductive layer which is applied to the substrate (3) and comprises an electrically conductive polymer P1;

ii) covering of a part of the electrically conductive layer with a covering layer D, comprising a polymer P2, from a covering phase to obtain at least one covered region $D_d$ and at least one non-covered region $D_u$ of the electrically conductive layer;

iii) reduction of the electrical conductivity of the electrically conductive layer in at least a part of the at least one non-covered region $D_u$ compared with the electrical conductivity of the electrically conductive layer in the at least one covered region $D_d$;

iv) at least partial removal of the covering layer D by an alkaline aqueous treatment.

In process step i) of the process according to the invention, a layered body comprising a substrate and an electrically conductive layer which follows the substrate and comprises an electrically conductive polymer P1 is first provided. In this context, the wording "an electrically conductive layer which follows the substrate" includes both layered bodies in which the electrically conductive layer is applied directly to the substrate and layered bodies in which one or more intermediate layers are provided between the substrate and the electrically conductive layer.

In this connection, films of plastic are preferred as the substrate, very particularly preferably transparent films of plastic, which conventionally have a thickness in a range of from 5 to 5,000 μm, particularly preferably in a range of from 10 to 2,500 μm and most preferably in a range of from 25 to 1,000 μm. Such films of plastic can be based, for example, on polymers, such as polycarbonates, polyesters, such as e.g. PET and PEN (polyethylene terephthalate or polyethylene-naphthalene dicarboxylate), copolycarbonates, polysuiphones, polyether sulphones (PES), polyimides, polyamides, polyethylene, polypropylene or cyclic polyolefins or cyclic olefin copolymers (COC), polyvinyl chloride, polystyrene, hydrogenated styrene polymers or hydrogenated styrene copolymers. In addition to plastics materials, possible substrates are, in particular, also substrates based on metals or metal oxides, such as, for example, ITO layers (indium tin oxide layers) or the like. Glass is furthermore preferred as the substrate.

This substrate is followed by a layer comprising an electrically conductive polymer P1, all the electrically conductive polymers known to the person skilled in the art being possible as the electrically conductive polymer P1. Examples of suitable electrically conductive polymers which may be mentioned at this point are, in particular, polythiophenes, polypyrrole or polyanilines.

Electrically conductive polymers which are particularly preferred according to the invention are polythiophenes, polythiophenes which can be employed being in principle all polymers with recurring units of the general formula (I)

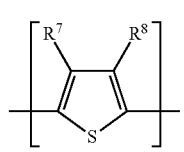

(I)

in which $R^7$ and $R^8$ independently of each other each represent H, an optionally substituted $C_1$-$C_{18}$-alkyl radical or an optionally substituted $C_1$-$C_{18}$-alkoxy radical, $R^7$ and $R^8$ together represent an optionally substituted $C_1$-$C_8$-alkylene radical, wherein one or more C atom(s) can be replaced by one or more identical or different hetero atoms chosen from O or S, preferably a $C_1$-$C_8$-dioxyalkylene radical, an optionally substituted $C_1$-$C_8$-oxythiaalkylene radical or an optionally substituted $C_1$-$C_8$-dithiaalkylene radical, or represent an optionally substituted $C_1$-$C_8$-alkylidene radical, wherein optionally at least one C atom is replaced by a hetero atom chosen from O or S.

In a particularly preferred embodiment of the process according to the invention, polythiophenes comprising recurring units of the general formula (I-a) and/or of the general formula (I-b) are preferred:

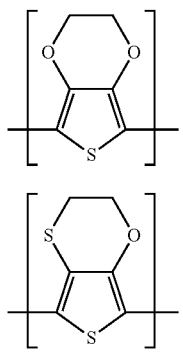

(I-a)

(I-b)

In the context of the invention, the prefix "poly-" is to be understood as meaning that the polythiophene contains more than one identical or different recurring unit. The polythiophenes contain n recurring units of the general formula (I) in total, wherein n can be an integer from 2 to 2,000, preferably 2 to 100. The recurring units of the general formula (I) can in each case be identical or different within one polythiophene. Polythiophenes containing in each case identical recurring units of the general formula (I) are preferred.

The polythiophenes preferably in each case carry H on the end groups.

In particularly preferred embodiments, the polythiophene is poly(3,4-ethylenedioxythiophene), poly(3,4-ethylenoxythiathiophene) or poly(thieno[3,4-b]thiophene, poly(3,4-ethylenedioxythiophene) being most preferred.

The optionally substituted polythiophenes are cationic, "cationic" relating only to the charges on the polythiophene main chain. The polythiophenes can carry positive and negative charges in the structural unit, depending on the substituent on the radicals $R^7$ and $R^8$, the positive charges being on the polythiophene main chain and the negative charges optionally being on the radicals R substituted by sulphonate or carboxylate groups.

In this context, the positive charges of the polythiophene main chain can be partly or completely satisfied by the anionic groups optionally present on the radicals R. Overall, in these cases the polythiophenes can be cationic, neutral or even anionic. Nevertheless, in the context of the invention they are all regarded as cationic polythiophenes, since the positive charges on the polythiophene main chain are the deciding factor. The positive charges are not shown in the formulae, since they are mesomerically delocalized. However, the number of positive charges is at least 1 and at most n, where n is the total number of all recurring units (identical or different) within the polythiophene.

However, according to the invention it is particularly preferable for the positive charges on the polythiophene main chain to be compensated by polyanions, a polyanion preferably being understood as meaning a polymeric anion which includes at least 2, particularly preferably at least 3, still more preferably at least 4 and most preferably at least 10 identical anionic monomer recurring units, which, however, do not necessarily have to be linked directly to one another. In this case, the electrically conductive composition and therefore also the electrically conductive layer accordingly comprises a polyanion in addition to the electrically conductive polymer, in particular in addition to the polythiophene.

Polyanions here can be, for example, anions of polymeric carboxylic acids, such as polyacrylic acids, polymethacrylic acid or polymaleic acids, or of polymeric sulphonic acids, such as polystyrenesulphonic acids and polyvinylsulphonic acids. These polycarboxylic and -sulphonic acids can also be copolymers of vinylcarboxylic and vinylsulphonic acids with other polymerizable monomers, such as acrylic acid esters and styrene. Preferably, the electrically conductive layer contains an anion of a polymeric carboxylic or sulphonic acid as the polyanion.

The anion of polystyrenesulphonic acid (PSS) is particularly preferred as the polyanion. The molecular weight ($M_W$) of the polyanions supplying the polyacids is preferably 1,000 to 2,000,000, particularly preferably 2,000 to 500,000. The molecular weight is determined via gel permeation chromatography with the aid of polystyrenesulphonic acids of defined molecular weights as the calibration standard. The polyacids or their alkali metal salts are commercially obtainable, e.g. polystyrenesulphonic acids and polyacrylic acids, or can be prepared by known processes (see e.g. Houben Weyl, Methoden der organischen Chemie, vol. E 20 Makromolekulare Stoffe, part 2, (1987), p. 1141 et seq.).

In this connection, it is particularly preferable for the electrically conductive layer to comprise a complex of the electrically conductive polymer, in particular of the polythiophene described above, and one of the polyanions described above, particularly preferably a complex of poly(3,4-ethylenedioxythiophene) and polystyrenesulphonic acid (so-called "PEDOT/PSS complexes"). The weight ratio of polythiophene to polyanion in these complexes is preferably in a range of from 1:0.3 to 1:100, preferably in a range of from 1:1 to 1:40, particularly preferably in a range of from 1:2 to 1:20 and extremely preferably in a range of from 1:2 to 1:15.

In this connection it is furthermore preferable for the electrically conductive layer to comprise 1 wt. % to 100 wt. %, particularly preferably at least 5 wt. % and most preferably at least 10 wt. %, in each case based on the total weight of the electrically conductive layer, of the complexes described above of an electrically conductive polymer and a polyanion, particularly preferably the complexes of poly(3,4-ethylenedioxythiophene) and polystyrenesulphonic acid.

The complexes described above of electrically conductive polymer and polyanion are preferably formed by oxidative polymerization, in the presence of the polyanion, of the monomers from which the electrically conductive polymer is formed. In the case of complexes of poly(3,4-ethylenedioxythiophene) and polystyrenesulphonic acid, the complexes are accordingly obtainable by the oxidative polymerization of 3,4-ethylenedioxythiophene in the presence of polystyrenesulphonic acid.

Processes for the preparation of the monomeric precursors for the preparation of the polythiophenes containing recurring units of the general formula (I) and derivatives thereof are known to the person skilled in the art and are described, for example, in L. Groenendaal, F. Jonas, D. Freitag, H.

Pielartzik & J. R. Reynolds, Adv. Mater. 12 (2000) 481-494 and the literature cited therein. Mixtures of various precursors can also be used.

In the context of the invention, derivatives of the abovementioned thiophenes are understood as meaning, for example, dimers or trimers of these thiophenes. Higher molecular weight derivatives, i.e. tetramers, pentamers etc., of the monomeric precursors are also possible as derivatives. The derivatives can be built up from both identical and different monomer units and can be employed in the pure form and in a mixture with one another and/or with the abovementioned thiophenes. In the context of the invention, oxidized or reduced forms of these thiophenes and thiophene derivatives are also included in the term "thiophenes" and "thiophene derivatives" as long as the same conductive polymers are formed in their polymerization as in the case of the abovementioned thiophenes and thiophene derivatives.

Very particularly preferred thiophene monomers are optionally substituted 3,4-ethylenedioxythiophenes, the use of unsubstituted 3,4-ethylenedioxythiophene as the thiophene monomer being very particularly preferred.

In the process according to the invention, the thiophene monomers are polymerized oxidatively in the presence of the polyanions, preferably in the presence of polystyrenesulphonic acid. Oxidizing agents which can be used are the oxidizing agents which are suitable for the oxidative polymerization of pyrrole; these are described, for example, in J. Am. Chem. Soc. 85, 454 (1963). Inexpensive oxidizing agents which are easy to handle, e.g. iron-III salts, such as $FeCl_3$, $Fe(ClO_4)_3$ and the iron-III salts of organic acids and of inorganic acids containing organic radicals, and furthermore $H_2O_2$, $K_2Cr_2O_7$, alkali metal and ammonium persulphates, alkali metal perborates, potassium permanganate and copper salts, such as copper tetrafluoroborate, are preferred for practical reasons. The use of persulphates and of iron-III salts of organic acids and of inorganic acids containing organic radicals has the great advantage in use that they do not have a corrosive action. Iron-III salts of inorganic acids containing organic radicals which may be mentioned are, for example, the iron-III salts of the sulphuric acid half-esters of $C_1$-$C_{20}$-alkanols, e.g. the Fe-III salt of lauryl sulphate. Iron-III salts of organic acids which may be mentioned are, for example: the Fe-III salts of $C_1$-$C_{20}$-alkylsulphonic acids, such as methane- and dodecanesulphonic acid; aliphatic $C_1$-$C_{20}$-carboxylic acids, such as 2-ethylhexylcarboxylic acid; aliphatic perfluorocarboxylic acids, such as trifluoroacetic acid and perfluorooctanoic acid; aliphatic dicarboxylic acids, such as oxalic acid, and above all of aromatic sulphonic acids optionally substituted by $C_1$-$C_{20}$-alkyl groups, such as benzenesulphonic acid, p-toluenesulphonic acid and dodecylbenzenesulphonic acid.

For the oxidative polymerization of the thiophene monomers of the formula (I), theoretically 2.25 equivalents of oxidizing agent are required per mol of thiophene (see e.g. J. Polym. Sc. Part A Polymer Chemistry vol. 26, p. 1287 (1988)). In practice, however, the oxidizing agent is used in a certain excess, e.g. an excess of from 0.1 to 2 equivalents per mol of thiophene.

The oxidative polymerization of the thiophene monomers in the presence of the polyanions can be carried out in water or in water-miscible organic solvents, such as, for example, methanol, ethanol, 1-propanol or 2-propanol, the use of water as the solvent being particularly preferred. In the case of 3,4-ethylenedioxythiophene as the thiophene monomer and polystyrenesulphonic acid as the polyanion, aqueous dispersions which are known as PEDOT/PSS dispersions and are obtainable, for example, under the trade name Clevios™ P from Heraeus Clevios GmbH are obtained in this manner. The concentration of the thiophene monomers and of the polyanions in the particular solvent is preferably chosen such that after the oxidative polymerization of the thiophene monomers in the presence of the polyanions a dispersion is obtained which contains the complexes of the polythiophene and the polyanion in a concentration in a range of from 0.05 to 50 wt. %, preferably in a range of from 0.1 to 10 wt. % and still more preferably in a range of from 1 to 5 wt. %.

The dispersions obtained after the polymerization are conventionally further treated with anion and/or cation exchangers, for example in order to at least partially remove from the dispersions metal cations still present in the dispersions.

In an embodiment which is preferred according to the invention, the covering layer comprises less than 20 wt. %, preferably less than 10 wt. % and particularly preferably less than 1 wt. %, in each case based on the covering layer, of a photolacquer. Photolacquer here is understood as meaning a polymer or polymer blend, the removability of which, preferably the solubility of which, can be modified by irradiation. This modification is often associated with a modification of the molecular weight of this polymer or polymer blend. The molecular weight can thus be increased by irradiation-induced crosslinking, or the molecular weight can be reduced by functionalities, such as from diazo groups, within the polymer or polymer blend which break open under irradiation. Further information on photolacquers can be found in E. Roβhaupter, D. Hundt: *Photolacke, Chemie in unserer Zeit.* 5, no. 5, 1971, p. 147-153. It is therefore furthermore preferable according to the invention for an irradiation of less than 20 $mJ/cm^2$, preferably less than 15 $mJ/cm^2$, preferably less than 10 $mJ/cm^2$ and particularly preferably less than 5 $mJ/cm^2$ to be carried out on the covering layer between step iii. and iv. The covering layer is thus exposed to little to no radiation. It is furthermore preferable according to the invention for the covering layer to comprise no photolacquer.

According to a preferred embodiment of the process according to the invention, the layered body S2 provided in process step i) is obtainable by a process comprising the process steps:
ia) provision of the substrate;
ib) application of a composition Z2 comprising the electrically conductive polymer P1 and a solvent to at least a part of the surface of the substrate;
ic) at least partial removal of the solvent to obtain an electrically conductive layer.

In process step ia), a substrate is first provided, those substrates which have already been mentioned above as preferred substrates being preferred as substrates. The surface of the substrates can be pretreated before the application of the electrically conductive layer, for example by treatment with a primer, by corona treatment, flame treatment, fluorination or plasma treatment, in order to improve the polarity of the surface and therefore the wettability and chemical affinity.

The dispersion described above which is obtained after the oxidative polymerization of the thiophene monomers in the presence of the polyanions and has preferably been treated beforehand with ion exchangers can be employed, for example, as the composition Z2 comprising the electrically conductive polymer P1 and optionally a polyanion and a solvent, which is applied to at least a part of the surface of the substrate in process step ib). Preferably, the composition Z2 applied in process step ib) contains an anion of a polymeric carboxylic or sulphonic acid as the polyanion. The composition Z2 is preferably a solution or dispersion comprising complexes of poly(3,4-ethylenedioxythiophene) and polystyrenesulphonic acid, the use of a PEDOT/PSS dispersion being particularly preferred.

Before such a dispersion is applied to the substrate surface in process step ib) as composition Z2 for the purpose of formation of an electrically conductive layer, still further additives which, for example, increase the conductivity, such as e.g. compounds containing ether groups, such as e.g. tetrahydrofuran, compounds containing lactone groups, such as butyrolactone, valerolactone, compounds containing amide or lactam groups, such as caprolactam, N-methylcaprolactam, N,N-dimethylacetamide, N-methylacetamide, N,N-dimethylformamide (DMF), N-methylformamide, N-methylformanilide, N-methylpyrrolidone (NMP), N-octylpyrrolidone, pyrrolidone, sulphones and sulphoxides, such as e.g. sulpholane (tetramethylene sulphone), dimethylsulphoxide (DMSO), sugars or sugar derivatives, such as e.g. sucrose, glucose, fructose, lactose, sugar alcohols, such as e.g. sorbitol, mannitol, furan derivatives, such as e.g. 2-furancarboxylic acid, 3-furancarboxylic acid, and/or di- or polyalcohols, such as e.g. ethylene glycol, glycerol or di- and triethylene glycol, can be added to the dispersion. Tetrahydrofuran, N-methylformamide, N-methylpyrrolidone, ethylene glycol, dimethylsulphoxide or sorbitol are particularly preferably employed as conductivity-increasing additives.

One or more binders, such as polyvinyl acetate, polycarbonate, polyvinylbutyral, polyacrylic acid esters, polyacrylamides, polymethacrylic acid esters, polymethacrylamides, polystyrene, polyacrylonitrile, polyvinyl chloride, polyvinylpyrrolidones, polybutadiene, polyisoprene, polyethers, polyesters, polyurethanes, polyamides, polyimides, polysulphones, silicones, epoxy resins, styrene/acrylic acid ester, vinyl acetate/acrylic acid ester and ethylene/vinyl acetate copolymers, polyvinyl alcohols or celluloses, can also additionally be added to the dispersion. The content of the polymeric binder, if this is employed, is conventionally in a range of from 0.1 to 90 wt. %, preferably 0.5 to 30 wt. % and very particularly preferably 0.5 to 10 wt. %, based on the total weight of the composition Z2.

Bases or acids, for example, can be added to the compositions Z2 to adjust the pH. Those additions which do not impair the film formation of the dispersions, such as e.g. the bases 2-(dimethylamino)-ethanol, 2,2'-iminodiethanol or 2,2',2''-nitrilotriethanol, are preferred.

According to a particularly preferred embodiment of the process according to the invention, the composition Z2 can also contain crosslinking agents which render possible crosslinking of the composition Z2 after application to the substrate surface. The solubility of the coating in organic solvents can thereby be lowered. Examples of suitable crosslinking agents which may be mentioned are, for example, melamine compounds, masked isocyanates, functional silanes—e.g. tetraethoxysilane, alkoxysilane hydrolysates, e.g. based on tetraethoxysilane, or epoxysilanes, such as 3-glycidoxypropyltrialkoxysilane. These crosslinking agents can be added to the composition in an amount in a range of from 0.01 to 10 wt. %, particularly preferably in an amount in a range of from 0.05 to 5 wt. % and most preferably in an amount in a range of from 0.1 to 1 wt. %, in each case based on the total weight of the composition Z2.

This composition Z2 can be applied in process step ib) by known processes, e.g. by spin coating, dipping, impregnation, pouring, dripping on, spraying, misting, knife coating, brushing or printing, for example ink-jet, screen, gravure, offset or tampon printing, to the substrate in a wet film thickness of from 0.5 μm to 250 μm, preferably in a wet film thickness of from 2 μm to 50 μm.

In process step ic), the solvent is then at least partially removed to obtain an electrically conductive layer which comprises the complexes according to the invention or the complexes obtainable by the process according to the invention, this removal preferably being carried out by simple evaporation.

Preferably, the thickness of the electrically conductive layer is 1 nm to 50 μm, particularly preferably in a range of from 1 nm to 5 μm and most preferably in a range of from 10 nm to 500 nm.

In process step ii), a part of the electrically conductive layer is covered with a covering layer D comprising a polymer P2. The covering is carried out from a covering phase to obtain at least one covered region $D_d$ and at least one non-covered region $D_u$ of the electrically conductive layer.

The polymer P2 is preferably based on ethylenically unsaturated monomer units, in particular on monoethylenically unsaturated monomer units, still more preferably on monomer units comprising at least one vinyl group. Monomer units comprising vinyl groups contain at least one C=C double bond which can be polymerized by known processes with further C=C double bonds or with further functional groups which can react with C=C double bonds, to give a polymer chain based at least partly on C—C recurring units. In this context, it is preferable for the polymer chain to be provided with side groups so that the properties of the polymer can be influenced. Preferred side groups are ionic functional groups, in particular groups which can be dissociated, preferably cationic or anionic groups which can be dissociated, preferably functional groups which allow a solubility in polar solvents.

In one embodiment according to the invention, the polymer P2 comprises at least one monomer α1, still more preferably at least one monomer α1 and at least one comonomer α3 or at least one monomer α2 and a comonomer α3, most preferably at least one monomer α1, at least one monomer α2 and at least one comonomer α3.

Suitable monomers α1 are ethylenically unsaturated, preferably monoethylenically unsaturated monomers which contain acid groups and can also be present at least in partially neutralized form, i.e. at least partially in the form of salts thereof. Preferred ethylenically unsaturated monomers α1 containing acid groups are monoethylenically unsaturated monomers containing carboxylic acid groups, ethylenically unsaturated sulphonic acid monomers and ethylenically unsaturated phosphonic acid monomers. Preferred monoethylenically unsaturated monomers containing carboxylic acid groups are acrylic acid, methacrylic acid, ethacrylic acid, acyanoacrylic acid, β-methacrylic acid (crotonic acid), α-phenylacrylic acid, β-acryloxypropionic acid, sorbic acid, 2'-methylisocrotonic acid, cinnamic acid, β-stearylic acid, itaconic acid, citraconic acid, mesaconic acid, glutaconic acid, aconitic acid, maleic acid and fumaric acid, acrylic acid and methacrylic acid being preferred. Preferred ethylenically unsaturated sulphonic acid monomers are allylsulphonic acid or aliphatic or aromatic vinylsulphonic acids or acrylic or methacrylic sulphonic acids. Preferred aliphatic or aromatic vinylsulphonic acids are vinylsulphonic acid, 4-vinylbenzylsulphonic acid, vinyltoluenesulphonic acid and styrenesulphonic acid. Preferred acryl- and methacrylsulphonic acids are sulphoethyl(meth) acrylic acid, sulphopropyl(methyl)acrylic acid, 2-hydroxy- 3-methacryloxypropylsulphonic acid and (meth)acrylamidoalkylsulphonic acids, such as 2-acrylamido-2-methylpropanesulphonic acid. Preferred ethylenically unsaturated phosphonic acid monomers are vinylphosphonic acid, allylphosphonic acid, vinylbenzylphosphonic acid (meth)acrylamidoalkylphosphonic acids, acrylamidoalkyldiphosphonic acids, phosphonomethylated vinylamines and (meth)acrylphosphonic acid derivatives.

Preferred salts of the monomers α1 comprise, for example, $Li^+$, $Na^+$, $K^+$ or $NH_4^+$ as the cation.

Particularly preferred monomers α1 are monomers comprising carboxylic acid groups or salts thereof, acrylic acid, methacrylic acid and salts thereof being preferred.

Preferred monomers α2 are derivatives of the abovementioned monomers α1 containing acid groups, preferably ester derivatives, in particular ester derivatives which are obtainable by reaction of one of the abovementioned carboxylic acids with a linear or branched $C_1$-$C_{20}$ alcohol, preferably with a linear or branched $C_1$-$C_{12}$ alcohol, preferably with a linear or branched $C_1$-$C_8$ alcohol, furthermore preferably with a linear or branched $C_1$-$C_4$ alcohol, alkyl alcohols being preferred as the alcohol, and ester derivatives of acrylic acid and ester derivatives of methacrylic acid being preferred. Particularly preferred ester derivatives are methyl acrylate, ethyl acrylate, propyl acrylate, butyl acrylate, methyl methacrylate, ethyl methacrylate, propyl methacrylate or butyl methacrylate.

The polymer P2 furthermore preferably comprises at least one comonomer α3 which can be copolymerized with the monomers α1 and α2, preferably at least one monoethylenically unsaturated monomer α3 which can be copolymerized with the monomers α1 and α2. Comonomers α3 which are suitable according to the invention are aryl groups substituted by at least one ethylenically unsaturated group, in particular aryl groups substituted by at least one monoethylenically unsaturated group and derivatives thereof substituted by at least one linear or branched $C_1$-$C_{20}$-alkyl group, styrene and styrene derivatives being preferred according to the invention.

According to a particularly preferred embodiment of the process according to the invention, the polymer P2 is a copolymer built up from methacrylic acid, butyl acrylate and styrene monomers or comonomers. Suitable polymers P2 are obtainable, for example, from Belland AG, Germany under the trade name Belland Polymer 88140.

Preferably, according to the invention, the covering phase comprises the polymer P2 in an amount in a range of from 10 wt. % to approx. 100 wt. %, preferably in an amount in a range of from 20 wt. % to 90 wt. %, still more preferably in an amount in a range of from 30 wt. % to 80 wt. %, still more preferably in an amount in a range of from 40 wt. % to 70 wt. %, still more preferably in an amount in a range of from 50 wt. % to 60 wt. %, based on the total weight of the covering phase. An amount of approx. 100 wt. % of the polymer P2 in the covering phase does not rule out the fact the a certain amount, e.g. less than 10 wt. %, preferably less than 9 wt. %, preferably less than 8 wt. %, preferably less than 7 wt. %, preferably less than 6 wt. %, preferably less than 5 wt. %, preferably less than 4 wt. %, preferably less than 3 wt. %, preferably less than 2 wt. %, most preferably less than 1 wt. %, based on the total weight of the covering phase, of impurities, for example impurities from the preparation process of the polymer P2, such as residual monomers, catalysts or salts or derivatives thereof, or also a residual amount of solvent, can also additionally be present. It is preferable for the covering phase to contain the polymer P2 in an amount of approx. 100 wt. %, for the covering phase to be present in the form of a film of the polymer P2, or for the polymer P2 to be present in the form of a melt, in particular in the absence of an added solvent. Preferably, according to the invention, the covering phase is present in the form of a liquid covering phase, the covering phase preferably comprising at least one solvent. A liquid covering phase is preferably a solution or a dispersion, in particular a solution or a dispersion of the polymer P2 in a solvent.

Preferred solvents are all solvents in which the polymer P2 is soluble or dispersible. Particularly preferably, these solvents are compatible with the electrically conductive layer and preferably with the material of the substrate, i.e. the solvents do not react with the electrically conductive layer and preferably also not with the substrate, and the electrically conductive layer and the substrate material are insoluble in the solvents. Suitable solvents are, preferably, water or water-miscible solvents. Water-miscible solvents are, for example, alcohols, esters, ketones, aldehydes, formamides or sulphoxides, alcohols, esters and ketones being preferred according to the invention. The solvent is preferably chosen from the group consisting of water, alcohols, esters, ketones or mixtures of two or more of these. Particularly preferably, alcohols, esters, ketones or mixtures of alcohols, of alcohols with esters or of alcohols with ketones are employed as solvents. Preferred alcohols are $C_1$-$C_{20}$-alcohols, preferably $C_1$-$C_{12}$-alcohols, preferably $C_1$-$C_8$-alcohols, in particular methanol, ethanol, 1-propanol, 2-propanol, 1-butanol, 2-butanol, sec-butanol, tert-butanol, pentanol, hexanol, heptanol, octanol and their particular isomers, ethanol, 1-propanol, 2-propanol, 1-butanol, 2-butanol and tert-butanol being particularly preferred. Preferred esters are esters of $C_1$-$C_{20}$-alcohols, preferably of $C_1$-$C_{12}$-alcohols, preferably of $C_1$-$C_8$-alcohols, in particular of methanol, ethanol, 1-propanol, 2-propanol, 1-butanol, 2-butanol, sec-butanol, tert-butanol, pentanol, hexanol, heptanol, octanol and their particular isomers, with $C_1$-$C_{20}$-carboxylic acids, preferably $C_1$-$C_{12}$-carboxylic acids, preferably $C_1$-$C_8$-carboxylic acids, esters of $C_1$-$C_8$-alcohols with $C_1$-$C_8$-carboxylic acids being preferred. Particularly preferred esters are methyl acetate, ethyl acetate, propyl acetate, butyl acetate, pentyl acetate, hexyl acetate and isomers thereof. Ketones which are preferred according to the invention are based on a $C_3$-$C_{20}$, preferably on a $C_3$-$C_{15}$, preferably on a $C_3$-$C_{12}$, still more preferably on a $C_3$-$C_{10}$, still more preferably on a $C_3$-$C_8$ radical. Particularly preferred ketones are acetone, methyl ethyl ketone, diethyl ketone, methyl propyl ketone, ethyl propyl ketone, dipropyl ketone, methyl isobutyl ketone and dibutyl ketone. The solvent is preferably a solvent mixture of two or more alcohols, of at least one alcohol with at least one ester, of at least one alcohol with at least one ketone or of at least one alcohol with at least one ester and at least one ketone. If the solvent is a solvent mixture of two solvents, these are preferably in a weight ratio in a range of from 1:99 to 99:1, preferably in a weight ratio in a range from 1:80 to 80:1, preferably in a weight ratio in a range of from 1:50 to 50:1, preferably in a weight ratio in a range of from 1:20 to 20:1, preferably in a weight ratio in a range of from 1:10 to 10:1, preferably in a weight ratio in a range of from 1:8 to 8:1, preferably in a weight ratio in a range of from 1:5 to 5:1, still more preferably in a weight ratio in a range of from 1:4 to 4:1.

The solvent or the solvent mixture preferably has a boiling point of below 200° C., preferably below 180° C., still more preferably below 150° C., furthermore preferably below 120° C., more preferably below 100° C. The removal of the solvent can thus preferably be carried out by simple evaporation, optionally by heating.

The covering phase preferably comprises the solvent in an amount in a range of from 90 wt. % to 0.05 wt. %, preferably in an amount in a range of from 80 wt. % to 10 wt. %, still more preferably in an amount in a range of from 70 wt. % to 20 wt. %, still more preferably in an amount in a range of from 60 wt. % to 30 wt. %, still more preferably in an amount in a range of from 50 wt. % to 40 wt. %, based on the total weight of the covering phase.

The covering phase can also comprise additives. Preferred additives are, for example, additives which influence the properties of the covering phase, such as the viscosity, the stability or the pH of the covering phase, or the solubility of the polymer P2 in the covering phase. Further preferred additives are additives which can influence the properties of the polymer P2, such as flexibility, heat resistance, brittleness or adhesion to the surface of the electrically conductive layer. Particularly preferred additives are surfactants, stabilizers, plasticizers, tackifiers, impact modifiers, viscosity modifiers, defoamers or adhesion promoters. The covering phase can comprise additives in an amount in a range of from 0.05 to 15 wt. %, preferably in an amount in a range of from 0.5 to 10 wt. %, preferably in an amount in a range of from 0.5 to 5 wt. %, based on the total weight of the covering phase.

In order to be able to obtain a liquid covering phase, the polymer P2, the solvent or solvents and the additives optionally present can be combined with one another in a mixture. It may also be advantageous to stir, to heat, or both, this mixture during or after the combining. Preferably, the mixture is heated to a temperature in a range of from 30° C. to 100° C., preferably to a temperature in a range of from 35° C. to 90° C., preferably to a temperature in a range of from 35° C. to 80° C., preferably to a temperature in a range of from 35° C. to 75° C., preferably while stirring, in order to obtain the liquid covering phase. The liquid covering phase can then be applied to the electrically conductive layer at this elevated temperature or also after cooling to a temperature which is below this elevated temperature, preferably to room temperature.

The liquid covering phase preferably has a viscosity in a range of from 1 mPa·s to 10,000 Pa·s, preferably in a range of from 10 mPa·s to 1,000 Pa·s, preferably in a range of from 100 mPa·s to 500 Pa·s, preferably in a range of from 1 Pa·s to 500 Pa·s, preferably in a range of from 10 Pa·s to 400 Pa·s, preferably in a range of from 100 mPa·s to 350 Pa·s. The viscosity can be adjusted, for example, by addition of solvent or viscosity modifier or also by the concentration of the polymer P2 in the covering phase, the viscosity increasing with increasing concentration of the polymer P2 in the covering phase. The above viscosities are measured with a Brookfield spindle viscometer at a temperature of 20° C.

According to a preferred embodiment according to the invention, the covering layer D is obtainable by a process comprising the process steps:

iia) application of the covering phase comprising the polymer P2 to a part of the electrically conductive layer;

iib) at least partial removal of the solvent to obtain the covering layer D.

In process step iia), the covering phase can be applied to a part of the electrically conductive layer in the form of a film, a foil, a melt or a liquid covering phase.

A film- or foil-like covering phase can be applied by means of processes known to the person skilled in the art, such as printing, pressing on, roller pressing or the like.

According to the invention, a liquid covering phase as described above is preferred. The liquid covering phase can be applied in process step iia) by known processes, e.g. by spin coating, dipping, impregnation, pouring, dripping on, spraying, misting, knife coating, brushing or printing, for example ink-jet, screen, gravure, relief, offset or tampon printing, to a part of the electrically conductive layer in a wet film thickness of from 0.5 µm to 250 µm, preferably in a wet film thickness of from 0.7 µm to 100 µm, more preferably in a wet film thickness of from 1 µm to 50 µm, still more preferably in a wet film thickness of from 2 µm to 20 µM. These processes are also suitable for a covering phase in the form of a melt.

Preferably, according to the invention, in process step iia) the covering layer D is applied to a part of the electrically conductive layer by means of a printing process, preferably by means of a gravure printing, screen printing or relief printing process.

During the application the covering phase can be present at room temperature, or also at elevated temperature, e.g. at a temperature in a range of from 30° C. to 100° C., preferably at a temperature in a range of from 35° C. to 90° C., preferably at a temperature in a range of from 35° C. to 80° C., preferably at a temperature in a range of from 35° C. to 75° C., room temperature being preferred.

In process step iib), the solvent is at least partially removed from the liquid covering phase applied, to obtain the covering layer D which comprises the polymer P2, this removal preferably being carried out by simple evaporation. The evaporation can be carried out at a temperature in a range of from 0° C. to 200° C., preferably at a temperature in a range of from 10° C. to 180° C., preferably at a temperature in a range of from 10° C. to 150° C., preferably at a temperature in a range of from 20° C. to 120° C., still more preferably at a temperature in a range of from 20° C. to 100° C.

Preferably, the thickness of the covering layer is 1 nm to 50 µm, particularly preferably in a range of from 1 nm to 20 µm and most preferably in a range of from 10 nm to 10 µm.

The covering is carried out from the covering phase to obtain at least one covered region $D_d$ and at least one non-covered region $D_u$ of the electrically conductive layer. The covered and the non-covered region $D_d$ and $D_u$ can each be continuous or discontinuous. If, for example, the covered region $D_d$ is a continuous region, the non-covered region $D_u$ can be a continuous or a discontinuous, preferably a discontinuous region $D_u$. If the non-covered region $D_u$ is a continuous region, the covered region $D_d$ can be a continuous or a discontinuous, preferably a discontinuous region $D_d$. In connection with the process according to the invention, it is preferable for the regions $D_d$ and $D_u$ to have a geometric shape, preferably a planar geometric shape chosen from the group consisting of a circle, a rectangle, rhombus, a triangle, tetragon, pentagon, hexagon, heptagon or octagon or a combination of at least two of these. In this connection, it is particularly preferable for the regions $D_d$ and $D_u$ together to form a circuit design. In this connection, it is furthermore preferable for the regions $D_d$ and $D_u$ each to have an area of at least 0.00001 mm², preferably at least 0.0001 mm², still more preferably at least 0.001 mm², still more preferably at least 0.01 mm², still more preferably at least 0.1 mm², still more preferably at least 1 mm² and most preferably at least 10 mm². Particularly preferably, in process step ii) the covering layer D is applied as a pattern, the covered and the non-covered regions $D_d$ and $D_u$ resulting from the pattern. The generation of these patterns is often also called structuring. The pattern can be, for example, a pattern for an electronic component, a circuit board, a touch panel, a touch screen or an antistatic coating. The covering layer D according to the invention comprising the polymer P2 has the advantage of a good adhesion to the surface of the electrically conductive layer, which allows a sharp transition between the at least one covered region $D_d$ and the at least one non-covered region $D_u$. This often linear transition preferably has a sharpness of less than 500 µm, preferably in a range of from 1 nm to 450 µm, preferably in a range of from 10 nm to 400 µm, more preferably in a range of from 100 nm to 350 µm, still more preferably in a range of from 1 µm to 300 µm, still more preferably in a range of from 10 µm to 200 µm, still more preferably in a range of from 10 µm to 150 µm.

In process step iii) of the process according to the invention, the electrical conductivity of the electrically conductive layer is reduced in at least a part of the at least one non-covered region $D_u$ compared with the electrical conductivity of the electrically conductive layer (4) in the at least one covered region $D_d$. Preferably, the covering layer D is thereby retained.

The covering layer D in the at least one covered region $D_d$ serves as a mask for the reduction in the electrical conductivity of the electrically conductive layer in the at least one non-covered region $D_u$ in process step iii). The good adhesion of the covering layer D according to the invention to the surface of the electrically conductive layer renders it possible to achieve a sharp transition between the electrically conductive region of the electrically conductive layer and the region in which the electrical conductivity has been reduced compared with the electrical conductivity of the electrically conductive region. This transition preferably has a sharpness of less than 500 µm, preferably in a range of from 1 nm to 450 µm, preferably in a range of from 10 nm to 400 µm, more preferably in a range of from 100 nm to 350 µm, still more preferably in a range of from 1 µm to 300 µm, still more preferably in a range of from 10 µm to 200 µm, still more preferably in a range of from 10 µm to 150 µm.

In a preferred embodiment of the process according to the invention, in process step iii) the electrical conductivity of the electrically conductive layer is reduced in at least a part of the at least one non-covered region $B_u$ by a factor of at least 10, preferably by a factor of at least 100, more preferably by a factor of at least 1,000, still more preferably by a factor of at least 10,000, compared with the electrical conductivity of the electrically conductive layer in the at least one covered region $B_d$.

Preferably, according to the invention, process step iii) includes at least one process step
iiia) bringing at least a part of the at least one non-covered region $B_u$ into contact with a composition Z1 comprising an organic compound which is capable of releasing chlorine, bromine or iodine.

According to the present invention, the wording "which is capable of releasing chlorine, bromine or iodine" is preferably understood as meaning an organic compound which, after addition of a solvent, preferably after addition of water, releases chlorine in the form of $Cl_2$, HOCl, $OCl^-$ or a mixture of at least two of these chlorine compounds, or bromine in the form of $Br_2$, HOBr, $OBr^-$ or a mixture of at least two of these bromine compounds, or iodine in the form of $I_2$, HIO, $IO^-$ or a mixture of at least two of these iodine compounds.

An organic compound which is capable of releasing chlorine, bromine or iodine and is particularly preferred according to the invention is an organic compound which comprises at least one structural element (II)

wherein
Hal is a halogen chosen from the group consisting of chlorine, bromine or iodine, but preferably represents chlorine or bromine,
Y is chosen from N, S and P, but preferably represents N, and
$X_1$ and $X_2$ can be identical or different and each represent a halogen, preferably chlorine or bromine, a carbon atom or a sulphur atom and wherein one or more further atoms can optionally be bonded to $X_1$ and $X_2$. The number of further atoms bonded to $X_1$ and $X_2$ depends on the covalence of $X_1$ and $X_2$.

According to a first particular embodiment of the process according to the invention, the organic compound comprises at least two structural elements (II) in which Hal represents a chlorine atom or a bromine atom and Y represents nitrogen, wherein these at least two structural elements (I) can optionally also be different. In this connection, according to a first process variant it is very particularly preferable for the organic compound to comprise the structural element (III)

in which a chlorine atom or a bromine atom is bonded to at least two of the nitrogen atoms. Among these organic compounds, sodium dichlorodiisocyanurate, sodium dibromodiisocyanurate, tribromoisocyanuric acid and trichloroisocyanuric acid are particularly preferred.

According to a second process variant of this first particular embodiment of the process according to the invention, it is preferable for the organic compound to comprise the structural element (IV)

in which a chlorine atom or a bromine atom is bonded to the two nitrogen atoms and in which $R^1$ and $R^2$ can be identical or different and represent a hydrogen atom or a $C_1$-$C_4$-alkyl group, in particular a methyl group or an ethyl group.

Particularly preferred organic compounds in this connection are chosen from the group consisting of bromo-3-chloro-5,5-dimethylhydantoin, 1-chloro-3-bromo-5,5-dimethylhydantoin, 1,3-dichloro-5,5-dimethylhydantoin and 1,3-dibromo-5,5-dimethylhydantoin.

According to a second particular embodiment of the process according to the invention, the organic compound comprises exactly one structural element (II). In this case also, Y preferably represents N.

According to a first process variant of this second particular embodiment of the process according to the invention, the organic compound is N-chlorosuccinimide or N-bromosuccinimide.

According to a second process variant of this second particular embodiment of the process according to the invention, the organic compound comprises the structural element (V)

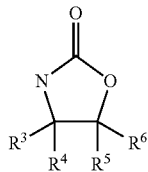

(V)

in which a chlorine atom or a bromine atom is bonded to the nitrogen atom and in which $R^3$, $R^4$, $R^5$ and $R^6$ can be identical or different and represent a hydrogen atom or a $C_1$-$C_4$-alkyl group, which can optionally be substituted by bromine or chlorine. In this connection, examples of suitable organic compounds which may be mentioned are 3-bromo-5-chloromethyl-2-oxazolidinone, 3-chloro-5-chloromethyl-2-oxazolidinone, 3-bromo-5-bromomethyl-2-oxazolidinone and 3-chloro-5-bromomethyl-2-oxazolidinone.

The organic compound according to the second particular embodiment of the process according to the invention can furthermore be, for example, halazone, an N,N-dichlorosulphonamide, an N-chloro-N-alkylsulphonamide or an N-bromo-N-alkylsulphonamide, in which the alkyl group is a $C_1$-$C_1$-alkyl group, particularly preferably a methyl group or an ethyl group.

According to a third particular embodiment of the process according to the invention, organic compounds chosen from the group consisting of 5-chloro-2-methyl-4-isothiazolin-3-one, 4,5-dichloro-2-n-octyl-4-isothiazolin-3-one, bromo-2-nitro-1,3-propanediol (BNPD), 2,2-dibromo-3-nitrilopropionamide, dibromonitroethyl propionate, dibromonitroethyl formate, sodium N-chloro-(4-methylbenzene)-sulphonamide or tetraglycine hydroperiodide are furthermore possible as the organic compound.

The composition employed in process step iiia) is preferably an aqueous solution or dispersion in which the organic compound is dissolved or dispersed. In this connection, it is particularly preferable for the aqueous solution or dispersion to have a pH, determined at 25° C., of at least 4, particularly preferably in a range of from 4 to 12, particularly preferably in a range of from 5 to 10 and most preferably in a range of from 6 to 8.

Preferably, the composition Z1, particularly preferably the aqueous solution or dispersion, comprises the organic compound described above in a concentration in a range of from 0.1 to 50 wt. %, particularly preferably in a range of from 0.5 to 35 wt. % and most preferably in a range of from 1 to 20 wt. %, in each case based on the total weight of the composition Z1.

According to a further particular embodiment of the process according to the invention for the production of a layered body, the composition Z1 employed in process step iii) or iiia), preferably the solution or dispersion employed in this process step, comprises cyanuric acid as a stabilizer as a further component in addition to the organic compound described above. It has been found, surprisingly, that the rate of release of chlorine, bromine or iodine can be regulated via the addition of cyanuric acid. In the case of the use of a solution or dispersion of the organic compound in process step iii) or iiia), the amount of cyanuric acid in the solution or dispersion is preferably in a range of from 1 to 500 mg/l, particularly preferably in a range of from 10 to 100 mg/l.

The bringing of the electrically conductive layer into contact with the composition Z1 in process step iiia) is preferably carried out by immersion, which can partly also be carried out, however, by complete submersion, of the electrically conductive layer in the composition Z1 or by printing the electrically conductive layer with the composition Z1, in principle all the processes which have already been described above as preferred application processes in connection with the application of the composition Z2 to the substrate surface, however, also being suitable. In order to ensure an adequate structuring, the electrically conductive layer remains in contact with the composition Z1, preferably the aqueous solution or dispersion, for about 1 second to 30 minutes, particularly preferably for about 30 seconds to 15 minutes and most preferably for about 1 to 5 minutes, before it is taken out again or before the composition Z1 is removed again. The temperature of the composition Z1 during the bringing into contact with the electrically conductive layer is preferably in a range of from 10 to 40° C., particularly preferably in a range of from 20 to 30° C., the use of a composition Z1 with room temperature (approx. 22-25° C.) being most preferred.

The process according to the invention can comprise as a further process step:

iiib) washing of the electrically conductive layer which has been brought into contact with the composition Z1, wherein the washing is preferably carried out by immersion of the layered body in a solvent, for example in water, and can be followed by a drying step.

According to a particular embodiment of the process according to the invention, the bringing of the electrically conductive layer into contact with the composition Z1 is carried out under conditions such that the colour separation $\Delta E_{before,\ after}$ is at most 4.5, particularly preferably at most 3.0 and most preferably at most 1.5, wherein the colour separation $\Delta E_{before,\ after}$ is calculated as follows:

$$\Delta E_{before,after} = \sqrt{(L^*_{before} - L^*_{after})^2 + (a^*_{before} - a^*_{after})^2 + (b^*_{before} - b^*_{after})^2}$$

In this context, $L^*_{before}$, $a^*_{before}$ and $b^*_{before}$ are the L, a and, respectively, b values of the L*a*b* colour space of the electrically conductive layer before the bringing into contact with the composition Z1 and $L^*_{after}$, $a^*_{after}$ and $b^*_{after}$ are the L, a and, respectively, b values of the L*a*b* colour space of the (formerly) electrically conductive layer after the bringing into contact with the composition Z1. In this context, for the purpose of the above requirement the layer after the bringing into contact with the composition Z1 is also still to be called the "electrically conductive layer" if the electrical conductivity is infinitesimally low as a consequence of the bringing into contact with the composition Z1.

The colour values L, a and b of the at least one covered region $D_d$ of the electrically conductive layer are changed neither by the covering layer D nor by application or removal thereof, so that the colour values L, a and b of the at least one covered region $D_d$ essentially correspond to the values $L^*_{before}$, $a^*_{before}$ and $b^*_{before}$ after removal of the covering layer D. This means that the difference in colour between the at least one covered region $D_d$ and the at least one non-covered region $D_u$ of the electrically conductive layer after the bringing into contact with the composition Z1, which difference in colour can be represented by the colour separation $\Delta E_{Dd, Du}$, preferably also corresponds to the colour separation $\Delta E_{before, after}$. The colour separation $\Delta E_{Dd, Du}$ is at most 4.5, particularly preferably at most 3.0 and most preferably at most 1.5, where the colour separation $\Delta E_{Dd, Du}$ is calculated as described above for the colour separation $\Delta E_{before, after}$ by replacing the values $L^*_{before}$, $a^*_{before}$ and $b^*_{before}$ by $L^*_{Dd}$, $a^*_{Dd}$ and $b^*_{Dd}$ and the values $L^*_{after}$, $a^*_{after}$ and $b^*_{after}$ by $L^*_{Du}$, $a^*_{Du}$ and $b^*_{Du}$. In this context, $L^*_{Dd}$, $a^*_{Dd}$ and $b^*_{Dd}$ are the L, a and, respectively, b values of the L*a*b* colour space of the electrically conductive layer in the at least one covered region $D_d$ after the bringing of the electrically conductive layer in the at least one non-covered region $D_u$ into contact with the composition Z1 and after removal of the covering layer D, and $L^*_{Du}$, $a^*_{Du}$ and $b^*_{Du}$ are the L, a and, respectively, b values of the L*a*b* colour space of the (formerly) electrically conductive layer in the at least one non-covered region $D_u$ after the bringing into contact with the composition Z1.

In the process according to the invention, it is advantageous if the colour and the difference in colour between the region untreated and treated with the composition Z1, i.e. between the at least one covered region $D_d$ and the at least one non-covered region $D_u$, does not change or changes only little during storage, during transportation or during use of the layered body. It is particularly preferable according to the invention for the L, a and b values of the L*a*b* colour space of the electrically conductive layer in the at least one covered region $D_d$ and the at least one non-covered region $D_u$ not to change or to change only little during storage, transportation or during use of the layered body. The changes can be measured e.g. before and after a climate test. The climate test is storage of the layered body for 1,000 hours at approx. 85° C. and approx. 85% relative atmospheric humidity. In this context, the colour separation $\Delta E_{Dd, before\ climate\ test;\ Dd,\ after\ climate\ test}$ should be at most 4.5, particularly preferably at most 3.0, more preferably at most 2.2 and most preferably at most 1.5. In this context, furthermore, the colour separation $\Delta E_{Du, before\ climate\ test;\ Du,\ after\ climate\ test}$ should be at most 4.5, particularly preferably at most 3.0 and most preferably at most 1.6. The colour separation $\Delta E_{Dd,\ before\ climate\ test;\ Dd.\ after\ climate\ test}$ and $\Delta E_{Du,\ before\ climate\ test;\ Du,\ after\ climate\ test}$ is calculated like the colour separation $\Delta E_{before, after}$, the values $L^*_{before}$, $a^*_{before}$, $b^*_{before}$, $L^*_{after}$, $a^*_{after}$, and $b^*_{after}$ being replaced in the equation by the respective values $L^*_{Dd,\ before\ climate\ test}$, $a^*_{Dd,\ before\ climate\ test}$, $b^*_{Dd,\ before\ climate\ test}$, $L^*_{Dd,\ after\ climate\ test}$, $a^*_{Dd,\ after\ climate\ test}$, and $b^*_{Dd\ after\ climate\ test}$. The colour separation $\Delta E_{Du,\ before\ climate\ test,\ Du.\ after\ climate\ test}$ is calculated like the colour separation $\Delta E_{before, after}$, the values $L^*_{before}$, $a^*_{before}$, $b^*_{before}$, $L^*_{after}$, $a^*_{after}$, and $b^*_{after}$ being replaced in the equation by the respective values $L^*_{Du,\ before\ climate\ test}$, $a^*_{Du,\ before\ climate\ test}$, $b^*_{Du, before\ climate\ test}$, $L^*_{Du,\ after\ climate\ test}$, $a^*_{Du,\ after\ climate\ test}$ and $b^*_{Du,\ after\ climate\ test}$. In this context, $L^*_{before\ climate\ test}$, $a^*_{before\ climate\ test}$ and $b^*_{before\ climate\ test}$ are the L, a and, respectively, b values of the L*a*b* colour space of the electrically conductive layer in the particular regions before the climate test and $L^*_{after\ climate\ test}$, $a^*_{after\ climate\ test}$ and $b^*_{after\ climate\ test}$ are the L, a and, respectively, b values of the L*a*b* colour space of the electrically conductive layer in the particular regions after the climate test. According to a particularly preferred embodiment of the layered body according to the invention, the difference in the colour separations $\Delta E_{Du,\ before\ climate\ test,\ Dd,\ after\ climate\ test}$ and $\Delta E_{Du,\ before\ climate\ test,\ Du,\ after\ climate\ test}$ ($|\Delta E_{Dd,\ before\ climate\ test,\ Dd,\ after\ climate\ test} -\Delta E_{Du,\ before\ climate\ test,\ Du\ after\ climate\ test}|$) is at most 3.0, preferably 2.0, particularly preferably at most 1.0 and most preferably at most 0.7.

It is furthermore preferable in the process according to the invention for the bringing of the electrically conductive layer into contact with the composition Z1 to be carried out under conditions such that the thickness of the electrically conductive layer in those regions which are brought into contact with the composition Z1 is reduced by at most 50%, particularly preferably by at most 25% and most preferably by at most 10%.

In process step iv. of the process according to the invention, the covering layer D is at least partially removed by an alkaline aqueous treatment. This is preferably carried out by bringing at least a part of the covering layer D into contact with an alkaline aqueous solution having a pH of >7, preferably having a pH in a range of from 8 to 14, more preferably having a pH in a range of from 9 to 13, still more preferably having a pH in a range of from 10 to 12. The alkaline solution is preferably an aqueous solution of a hydroxide of a metal of groups 1 or 2 of the periodic table, in particular sodium hydroxide, potassium hydroxide, magnesium hydroxide or calcium hydroxide, or an aqueous solution of ammonia, $NH_4OH$.

The bringing into contact is preferably carried out by immersion of the electrically conductive layer in the alkaline aqueous solution or by printing the electrically conductive layer with the alkaline aqueous solution, in principle all the processes which have already been described above as preferred application processes in connection with the application of the composition Z2 to the substrate surface, however, also being suitable. In order to ensure an adequate removal of the covering layer D, the electrically conductive layer remains in contact with the alkaline aqueous solution for about 1 second to 30 minutes, particularly preferably for about 30 seconds to 15 minutes and most preferably for about 1 to 5 minutes, before it is taken out again or before the alkaline aqueous solution is removed again. The temperature of the alkaline aqueous solution during the bringing into contact with the electrically conductive layer is preferably in a range of from 10 to 40° C., particularly preferably in a range of from 20 to 30° C., the use of a composition Z1 with room temperature (25° C.) being most preferred. Washing of the electrically conductive layer, preferably washing with water, preferably follows the removal of the covering layer, optionally followed by drying, preferably by drying at a temperature in a range of from 20 to 100° C., preferably in a range of from 25 to 80° C.

The process according to the invention can furthermore comprise a process step
v) treatment of the layered body S2 with an acidic solution having a pH of <7, preferably a pH in a range of 1-6, preferably a pH in a range of 1-5, preferably a pH in a range of 1-4.

The acidic solution is preferably an aqueous solution of an organic or an inorganic acid, preferably of an inorganic acid. Preferred inorganic acids are sulphonic acid, sulphuric acid, phosphoric acid, hydrochloric acid or nitric acid, sulphuric acid being preferred. This process step serves to improve the surface resistance in the electrically conductive regions of the electrically conductive layer. The treatment is preferably carried out by immersion of the electrically conductive layer in the acidic solution or by printing the electrically conductive layer with the acidic solution, in principle all the processes which have already been described above as preferred application processes in connection with the application of the composition Z2 to the substrate surface, however, also being suitable. In order to ensure an adequate improvement of the surface resistance, the electrically conductive layer remains in contact with the acidic solution for about 1 second to 30 minutes, particularly preferably for about 30 seconds to 15 minutes and most preferably for about 1 to 5 minutes, before it is taken out again or before the acidic solution is removed again. The temperature of the acidic solution during the treatment is preferably in a range of from 10 to 40° C., particularly preferably in a range of from 20 to 30° C., the use of an acidic solution with room temperature (25° C.) being most preferred.

Preferably, according to the invention, after at least one of the process steps i) to v) at least one washing or at least one drying or at least one washing and at least one drying are carried out, the washing preferably being carried out with water and the drying being carried out at a temperature in a range of from 10 to 200° C., preferably in a range of from 20 to 150° C., more preferably in a range of from 30 to 120° C., still more preferably in a range of from 40 to 100° C.

After process steps i) to iv), preferably after process steps i) to v), a layered body S2 is obtained which has at least one electrically conductive region and at least one region with an electrical conductivity reduced compared with the electrically conductive region by a factor of at least 10, preferably by a factor of at least 100, more preferably by a factor of at least 1,000, still more preferably by a factor of at least 10,000. Most preferably, the electrical conductivity in the at least one region with a reduced electrical conductivity compared with the electrically conductive region is destroyed completely.

In a further preferred embodiment, at least a part of the layered body S1 or S2 is heated before, after or during one or more of the process steps ii to iv. Preferably, the heating is carried out in process step iii. In this optional process step it is preferable for the substrate to be heated with the aid of, for example, a heating element after application of the electrically conductive layer. It is preferable for the substrate likewise to be heated during process steps iii and iv. Any apparatus which renders it possible to be able to heat the substrate or the layered body to various temperatures is conceivable as the heating element. This can be, for example, a heatable plate, which can be heated, for example, by hot air or a heatable water bath or by a heating coil. The temperature which the substrate or the layered body has during this heating process is preferably in a range of from 25 to 200° C., preferably in a range of from 25 to 100° C., particularly preferably in a range of from 30 to 80° C. and very particularly preferably in a range of from 40 to 70° C. Preferably, the substrate or the layered body is heated for various periods of time. It is thus preferable for the period of time of heating in at least one of the process steps ii to iv to be in a range of from 0.1 sec to 24 h, preferably in a range of from 1 sec to 10 h, particularly preferably in a range of from 10 sec to 2 h. Further more it is preferred that the period of time of heating in at least one of the process steps ii to iv to be in a range from 0.1 sec to 120 sec, preferably in a range from 1 to 90 sec and particularly preferably in a range from 1.5 to 70 sec. In process step iii it is preferable for the covered layered body to be brought into contact with a further solution or dispersion in order to reduce the electrical conductivity in the non-covered regions $D_u$, as already described above. This bringing into contact can be carried out, for example, via a roller, a sponge or other absorbent materials, such as, for example, paper. Examples of such processes are given in the description of the figures.

A contribution towards achieving the abovementioned objects is also made by a layered body S2 which is obtainable by the process according to the invention described above, wherein at least three, preferably at least four, preferably at least five and particularly preferably at least ten areas, preferably different from one another, follow one another, it being preferable for at least one area to be surrounded by at least one further area to the extent of at least 70%, preferably at least 80% and particularly preferably at least 90% of the outline of the at least one area. According to the invention, follow one another is understood as meaning directly in the sense of directly adjacent or indirectly in the sense of spaced by something.

The layered body S2 produced by the process according to the invention preferably has A) at least one area A in which the layer which follows the substrate has a surface resistance R;
B) at least one area B in which the layer which follows the substrate has a surface resistance which is 10 times, particularly preferably 100 times, still more preferably 1,000 times, still more preferably 10,000 times and most preferably 100,000 times greater than R;

wherein the colour separation $\Delta E_{area\ A,\ area\ B}$ is at most 4.5, particularly preferably at most 3.0 and most preferably at most 1.5.

The term "follow" here relates both to following directly in the sense of being directly adjacent and following indirectly via a separation, following directly being preferred. It is preferable for two and more areas to lie in one plane and particularly preferably in one layer. The area A preferably corresponds to the region or the regions $D_d$ and the area B preferably corresponds to the region or the regions $D_u$ of the process according to the invention. The colour separation $\Delta E_{area\ A,\ area\ B}$ is calculated as described below.

A contribution towards achieving the abovementioned objects is also made by a layered body comprising a substrate and a layer which follows the substrate and comprises an electrically conductive polymer P, wherein the layered body comprises A) at least one area in which the layer which follows the substrate has a surface resistance R;
B) at least one area in which the layer which follows the substrate has a surface resistance which is 10 times, particularly preferably 100 times, still more preferably 1,000 times, still more preferably 10,000 times and most preferably 100,000 times greater than R;

wherein the colour separation $\Delta E_{area\ A,\ area\ B}$ is at most 4.5, particularly preferably at most 3.0 and most preferably at most 1.5.

The colour separation $\Delta E_{area\ A,\ area\ B}$ is calculated as follows:

$$\Delta E_{areaA, areaB} = \sqrt{(L^*_{areaA} - L^*_{areaB})^2 + (a^*_{areaA} - a^*_{areaB})^2 + (b^*_{areaA} - b^*_{areaB})^2}$$

In this context, $L^*_{area\ A}$, $a^*_{area\ A}$ and $b^*_{area\ A}$ are the L, a and, respectively, b values of the L*a*b* colour space of the areas A and $L^*_{area\ B}$, $a^*_{area\ B}$ and $b^*_{area\ B}$ are the L, a and, respectively, b values of the L*a*b* colour space of the areas B.

The area A preferably corresponds to the region or the regions $D_d$ and the area B preferably corresponds to the region or the regions $D_u$ of the process according to the invention.

In the process according to the invention, it is advantageous if the colour of the area A and the colour of the area B and the difference in colour between the area A and the area B do not change or change only very little during storage, during transportation or during use of the layered body. It is particularly preferable according to the invention for the L, a and b values of the L*a*b* colour space of the electrically conductive layer in the area A and the area B not to change or to change only little during storage, transportation or during use of the layered body. The changes can be measured e.g. before and after a climate test. A suitable climate test is storage of the layered body for 1,000 hours at approx. 85° C. and approx. 85% relative atmospheric humidity. In this context, the colour separation $\Delta E_{area\ A,\ before\ climate\ test;\ area\ A,\ after\ climate\ test}$ should be at most 4.5, particularly preferably at most 3.0, more preferably 2.2 and most preferably at most 1.5. In this context, furthermore, the colour separation $\Delta E_{area\ B,\ before\ climate\ test;\ area\ B,\ after\ climate\ test}$ should be at most 4.5, particularly preferably at most 3.0 and most preferably at most 1.6. The colour separation $\Delta E_{area\ A,\ before\ climate\ test;\ area\ A,\ after\ climate\ test}$ and $\Delta E_{area\ B,\ before\ climate\ test;\ area\ B,\ after\ climate\ test}$ is calculated like the colour separation $\Delta E_{area\ A,\ area\ B}$, the values $L^*_{area\ A}$, $a^*_{area\ A}$, $b^*_{area\ A}$, $L^*_{area\ B}$, $a^*_{area\ B}$ and $b^*_{area\ B}$ being replaced in the equation by the respective values $L^*_{area\ A,\ before\ climate\ test}$, $a^*_{area\ A,\ before\ climate\ test}$, $b^*_{area\ A,\ before\ climate\ test}$, $L^*_{area\ A,\ after\ climate\ test}$, $a^*_{area\ A,\ after\ climate\ test}$ and $b^*_{area\ A,\ after\ climate\ test}$. The colour separation $\Delta E_{area\ B,\ before\ climate\ test,\ area\ B\ after\ climate\ test}$ is calculated like the colour separation $\Delta E_{before,\ after}$, the values $L^*_{before}$, $a^*_{before}$, $b^*_{before}$, $L^*_{after}$, $a^*_{after}$ and $b^*_{after}$ being replaced in the equation by the respective values $L^*_{area\ B,\ before\ climate\ test}$, $a^*_{area\ B,\ before\ climate\ test}$, $b^*_{area\ B,\ before\ climate\ test}$, $L^*_{area\ B,\ after\ climate\ test}$, $a^*_{area\ B,\ after\ climate\ test}$ and $b^*_{area\ B,\ after\ climate\ test}$.

In this context, the respective value $L^*_{before\ climate\ test}$, $a^*_{before\ climate\ test}$ and $b^*_{before\ climate\ test}$ for area A and for area B are the L, a and, respectively, b values of the L*a*b* colour space of the electrically conductive layer in the particular areas A and B before the climate test and $L^*_{after\ climate\ test}$, $a^*_{after\ climate\ test}$ and $b^*_{after\ climate\ test}$ for area A and for area B are the L, a and, respectively, b values of the L*a*b* colour space of the electrically conductive layer in the particular areas A and B after the climate test.

According to a particularly preferred embodiment of the layered body according to the invention, the difference in the colour separations $\Delta E_{area\ A,\ before\ climate\ test,\ area\ A,\ after\ climate\ test}$ and $\Delta E_{area\ B,\ before\ climate\ test,\ area\ B,\ after\ climate\ test}$ ($|\Delta E_{area\ A,\ before\ climate\ test,\ area\ A,\ after\ climate\ test} - \Delta E_{area\ B,\ before\ climate\ test,\ area\ B,\ after\ climate\ test}|$) is at most 3.0, preferably at most 2.0, particularly preferably at most 1.0 and most preferably at most 0.7.

Preferably the transition sharpness between the area A and the area B is less than 500 µm, preferably in a range of from 1 nm to 450 µm, preferably in a range of from 10 nm to 400 µm, more preferably in a range of from 100 nm to 350 µm, still more preferably in a range of from 1 µm to 300 µm, still more preferably in a range of from 10 µm to 200 µm, still more preferably in a range of from 10 µm to 150 µm. The "transition sharpness" describes the sharpness of the transition between the area A and the area B.

Preferred substrates and electrically conductive polymers are those substrates and electrically conductive polymers which have already been mentioned above as preferred substrates and electrically conductive polymers in connection with the process according to the invention. In connection with the layered body S2 (1) according to the invention, it is furthermore also preferable for the layer to comprise complexes of a polythiophene and a polyanion, those complexes which have already been mentioned above as preferred complexes in connection with the process according to the invention also being preferred here. In this connection, complexes of poly(3,4-ethylenedioxythiophene) and polystyrenesulphonic acid are very particularly preferred. The thickness of the layer also preferably corresponds to the thickness of the electrically conductive layer (4), as has been described above as the preferred layer thickness in connection with the process according to the invention.

In the case in particular of a layer which comprises complexes of poly(3,4-ethylenedioxythiophene) and polystyrenesulphonic acid, it is preferable for the surface resistance R to have a value in a range of from 1 to $10^9$ Ω/square, particularly preferably in a range of from 10 to $10^6$ Ω/square and most preferably in a range of from 10 to $10^3$ Ω/square.

In connection with the layered body according to the invention, it is furthermore preferable for the following to apply to the thickness of the electrically conductive layer in the areas A ($S_A$) and B ($S_B$):

$S_B/S_A \geq 0.5$, particularly preferably $\geq 0.75$ and most preferably $\geq 0.90$.

In this context, for the purpose of the above requirement the layer in the areas B is also to be interpreted as an "electrically conductive layer" if the electrical conductivity of this layer is infinitesimally low.

According to a particular embodiment of the layered body according to the invention, the difference in the transmission of the areas (A) and (B) ($|T_A - T_B|$) is at most 5%, particularly preferably at most 3% and most preferably at most 1% of the value of the transmission of the areas A ($T_A$).

In connection with the layered body according to the invention, it is furthermore preferable for the areas A and B to have a geometric shape, preferably a planar geometric shape chosen from the group consisting of a circle, a rectangle, rhombus, a triangle, tetragon, pentagon, hexagon, heptagon or octagon or a combination of at least two of these. In this connection, it is particularly preferable for the areas A and B together to form a circuit design. In this connection, it is furthermore preferable for the areas A and B each to have an area of at least 0.00001 mm², preferably at least 0.0001 mm², still more preferably at least 0.001 mm², still more preferably at least 0.01 mm², still more preferably at least 0.1 mm², still more preferably at least 1 mm² and most preferably at least 10 mm².

A contribution towards achieving the abovementioned objects is also made by the use of a layered body obtainable by the process according to the invention or a layered body according to the invention for the production of electronic components, in particular organic light-emitting diodes, organic solar cells or non-visible electrical leads, which are preferably provided on transparent substrates, for the production of touch panels or touch screens or for the production of an antistatic coating.

A contribution towards achieving the abovementioned objects is also made by an electronic component, a touch panel or a touch screen comprising a layered body obtainable by the process according to the invention or a layered body according to the invention. Preferred electronic components are, in particular, organic light-emitting diodes, an organic solar cell.

The invention is now explained in more detail with the aid of figures, test methods and non-limiting examples.

Figure 2:
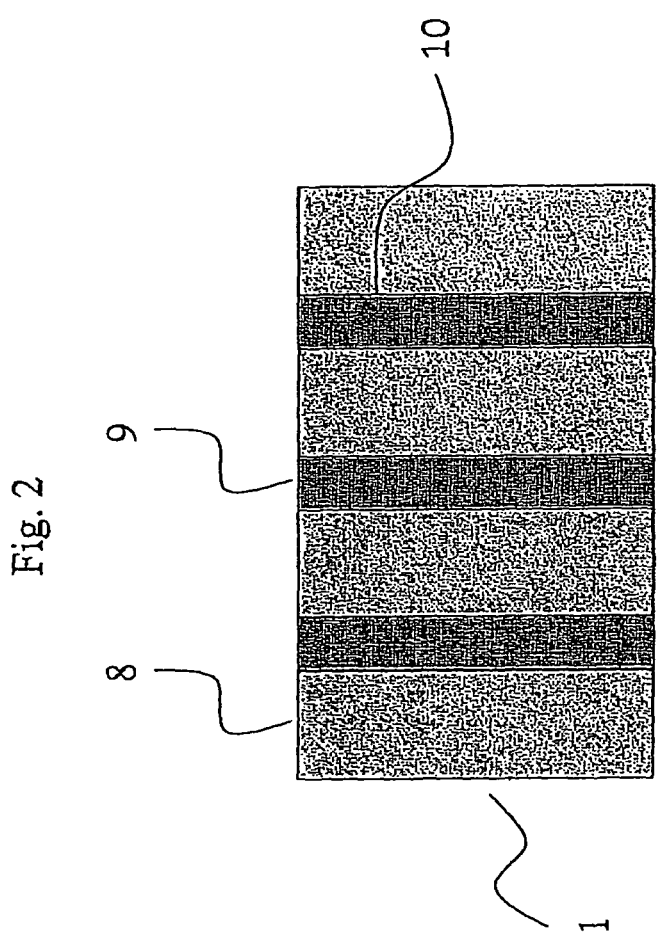
FIG. 2 shows the same layered body 1 from the top.

FIG. 1 shows the structure of a layered body 1 according to the invention, for example an antistatic film, in a general form in cross-section. A coating which includes areas 8 with a surface resistance R and areas 9 with a surface resistance which is 10 times greater than R is applied to a substrate 2. FIG. 2 shows the same layered body 1 from the top.

Figure 3:
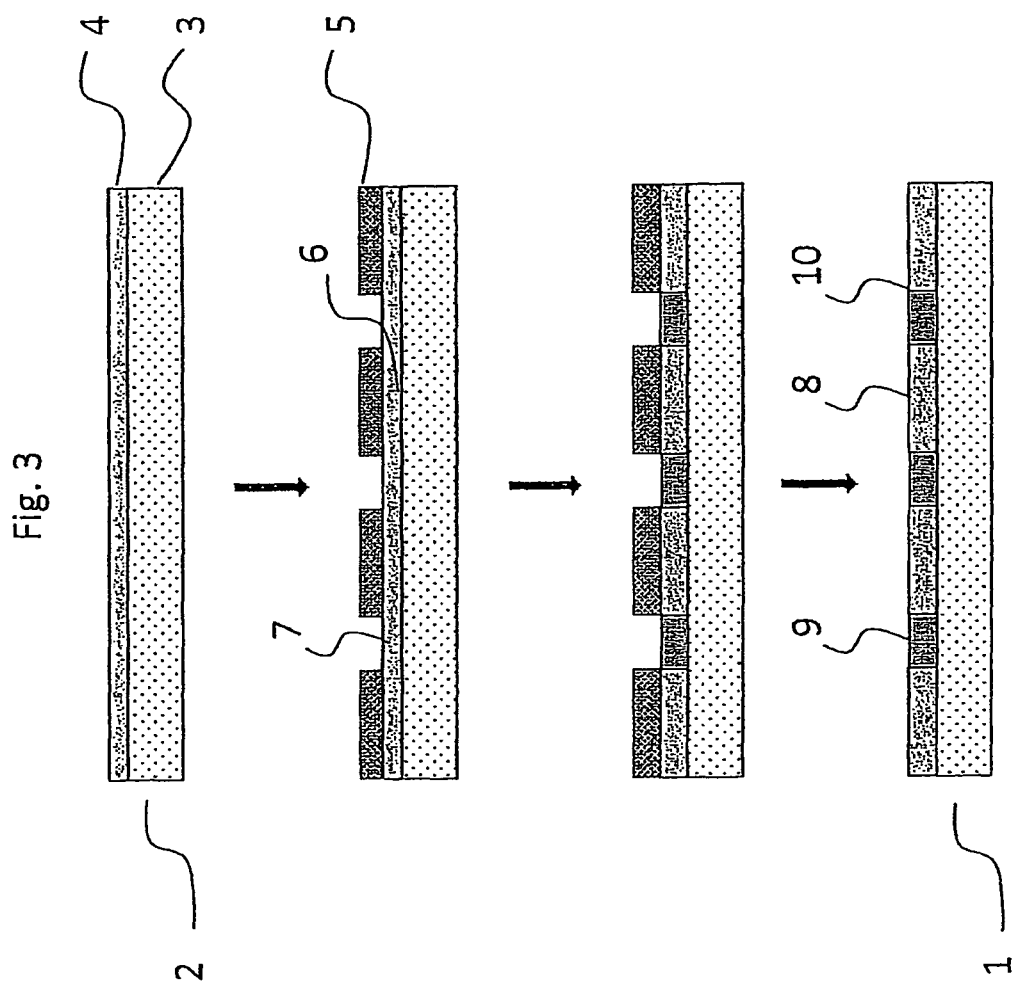
FIG. 3 shows a diagram of the process according to the invention.

FIG. 3 shows a diagram of the process according to the invention. In a first step, a layered body 2, which comprises substrate 3 and electrically conductive layer 4, is partially covered with a covering layer 5 to obtain non-covered regions 7 and covered regions 6. This step corresponds to process step ii) of the process according to the invention. In a subsequent step, the electrical conductivity of the non-covered regions 7 of the covered layered body 2 is reduced. This step corresponds to process step iii) of the process according to the invention. In a subsequent step, corresponding to process step iv) of the process according to the invention, the covering layer is removed to obtain a layered body 1 which has regions 8 with a surface resistance R and regions 9 with an increased surface resistance compared with the regions 8. A transition with a transition sharpness of 10 is formed between the regions 8 and 9.

The differences in colour between the areas 8 and 9 shown in FIGS. 1-3 serve merely to illustrate the figures. Differences in colour do not or scarcely occur in the layered bodies according to the invention.

Figure 4:
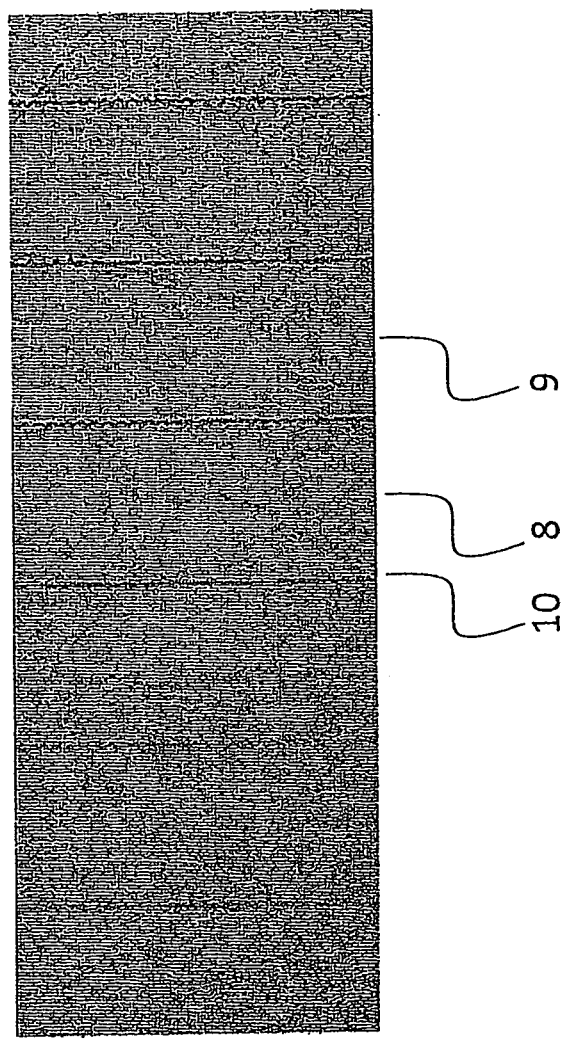
FIG. 4 shows the result of the treatment of a PEDOT/PSS layer by means of a process according to the invention.

FIG. 4 shows the result of the treatment of a PEDOT/PSS layer by means of a process according to the invention. The regions 8 and 9 cannot be distinguished from one another in colour. The transition sharpness 10 depends on the printing method.

Figure 5A:
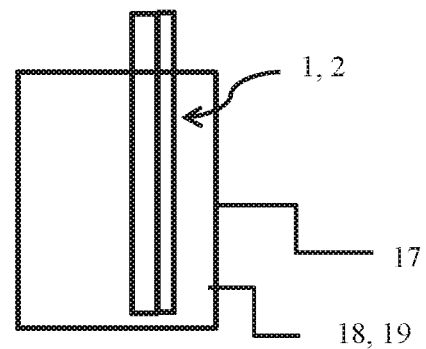
FIG. 5a shows a dipping process for application of various substances to a layered body 2.

FIG. 5a shows a dipping process for application of various substances to a layered body 2. For this, the desired substance 18, 19 which is to be applied to the layered body 2 is provided as a liquid in a bath 17. This can be, for example, a solution P1 19 or a solution Z1 18, depending on the step in which the dipping process is used. By using a dipping bath 17, a large amount of solution 18, 19 is required in order to wet the layered body 2 completely. Heating of such a dipping bath 17 is very expensive, since the entire solution 18, 19 must be heated. Furthermore, the production of a layered body 1 by means of the dipping process described here takes at least 1 to approx. 30 min in order to bring the part regions which are to be non-conducting to a surface resistance of $10^{10}$ ohm/square.

Figure 5B:
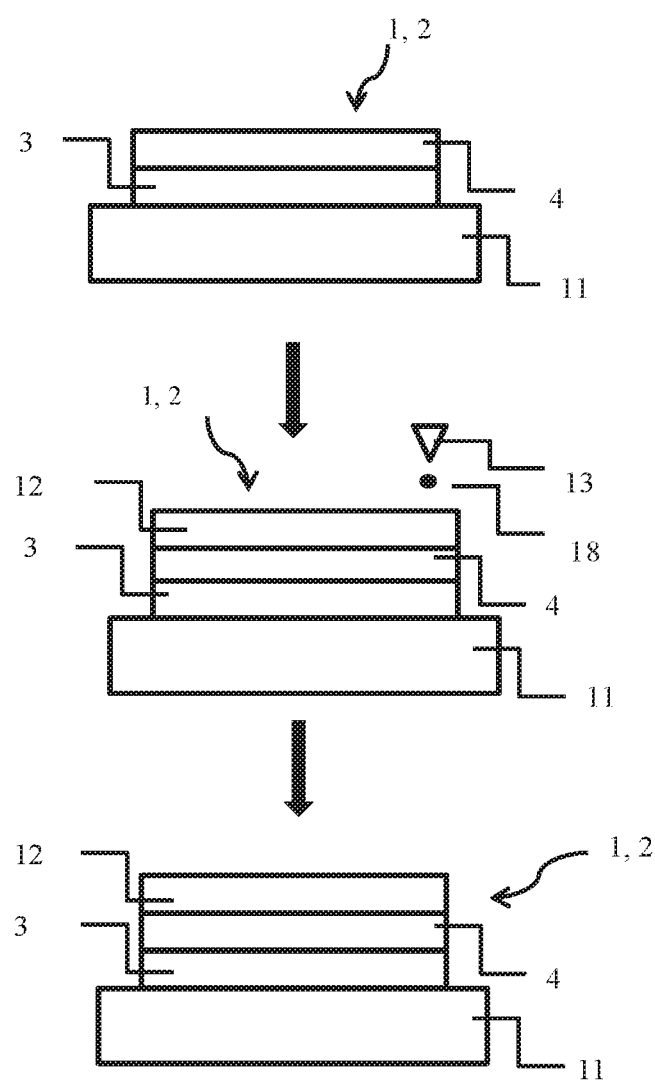
FIG. 5b shows a process such as can be employed in the production of the layered body 1 according to the invention or in the process according to the invention for the production of the layered body 1.

This process time can be reduced to 1 to 30 seconds if the following process, as shown in FIG. 5b, is applied to the layered body 2. While in connection with the process shown in FIG. 5a a dipping process can be referred to in general terms, the process shown in FIG. 5b is generalized as dipping-free. FIG. 5b shows a process such as can be employed in the production of the layered body 1 according to the invention or in the process according to the invention for the production of the layered body 1. This process can assist step iii and iv of the process according to the invention in order to free part regions of the layered body 2 from their electrical conductivity. For this, after application of the electrically conductive layer 4 and the covering layer D 5, the substrate 3 can be positioned on a heating element 11 and heated there to various temperatures for various periods of time. A metal plate (not shown here) can additionally be located between the actual heating element 11 and the layered body 2 for faster transfer of the heat to the layered body 2. In this example the heating element 11 has been heated to 65° C. in the form of a water bath. In a further step 100, as is explained in still more detail in Example 3, a solution Z1 18 is brought into contact with the layered body 2. This bringing into contact can be carried out, for example, via a roller, a sponge, a gel or other absorbent materials. In this example, an absorbent material 12 in the form of a paper layer 12 (Whatmann 602 from Whatmann) has been applied to the layered body 2 coated with P2. This absorbent material 12 can be impregnated with a solution of Z1 18, or dripped on with a solution Z1 18 via, for example, a nozzle 13, as shown in the middle diagram of FIG. 5b. The dripping on of the solution 18 can be carried out in this context with a resolution of from 1 to 1,000 μm. After application of the etching solution 18 to the paper 12, the etching solution is left to act for 1 to 60 sec. In step 110, the paper 12 is removed from the layered body 2.

By the process described, both the substrate 3 and the entire layered body 2 can be heated and/or wetted with solution 18 in part or in its entirety in a simple manner. By this combined heating and etching process, the conversion of the layered body 2 into the layered body 1 according to the invention can be carried out within a few seconds or even fractions of a second. Washing with ethanol in an ultrasound bath for 5 seconds (not shown in the diagram) forms the conclusion of this additional process step.

Figure 6:
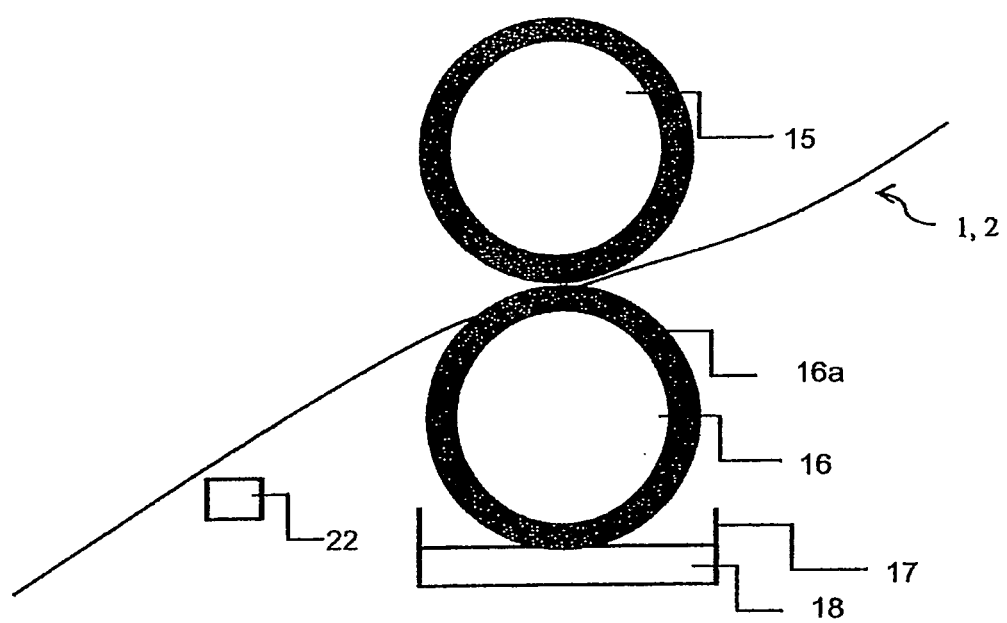
FIG. 6 shows a process for transferring the substance to be transferred to the layered body 2 in the form of a solution 18.

A further possibility of transferring the substance to be transferred to the layered body 2 in the form of a solution 18 is shown in FIG. 6. In this, the layered body 2 is passed along a heatable roll 15 and a roll 16 for transfer of a substance. This process design can be generalized as a roll process.

The layered body 2 is first brought into contact with at least a part of the layered body 2 with the first roll 15. In this context, the substrate 3 preferably points in the direction of the roll 15 (not shown here). The roll 15, for example in the form of a roller 15, can be heated. This can be effected, for example, by passing a hot gas or a hot liquid through the roll 15. The layered body 2 can be brought into contact with the roll 15 for different lengths of time. In this example it has been brought into contact with the roll 15 for 5 seconds. The contact time can be determined both by the speed of the moving layered body and/or by the contact area between the layered body 2 with the roll 15. The same also applies to the roll 16. The layered body can be brought to a temperature in a range of between 25 and 100° C. in this manner.

The layered body 1, 2 can subsequently or simultaneously be brought into contact with the second roll 16. This roll 16 has an absorbent surface 16a with which it can come into contact with the layered body 2, preferably on the opposite side to the first roll 15. The roll 16 can also be brought into contact with the layered body 2 on the same side as roll 15 (not shown here). Before contact with the layered body 2, the surface 16a is impregnated in a bath 17 which contains a solution 18. The solution 18 can be renewed continuously in the bath 17, so that the concentration of the substances in the solution 18 is always constant. After this, the layered body 2 can be passed through or over a washing station 22 in order to configure the layered body 1. The washing station 22 can be, for example, a bath or a spray unit for water or other wash solutions, for example alcohol, such as ethanol. In contrast to the dipping process, as has been shown in FIG. 5a, continuous films of the layered body 1 can be produced in this manner. The consumption of energy and of active substances and solvents is reduced considerably with this process compared with the dipping process from FIG. 5a.

Figure 7:
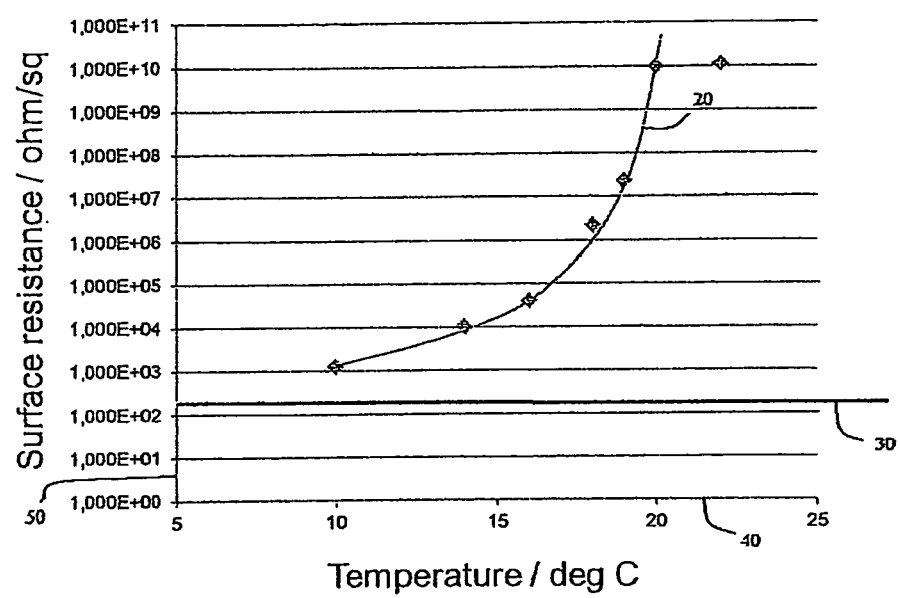
FIG. 7 shows a graph in which the surface resistance is plotted on the y axis 50 against the temperature in Celsius on the x axis 40 for different regions of a 12 μm thick layered body 1 treated with FET (wet film thickness as stated under Example 1 and FIG. 3).

FIG. 7 shows a graph in which the surface resistance is plotted on the y axis 50 against the temperature in Celsius on the x axis 40 for different regions of a 12 μm thick layered body 1 treated with FET (wet film thickness as stated under Example 1 and FIG. 3). The curve 20 shows the behaviour of the surface resistance of an etched region which remained non-covered as the non-covered region $D_u$ 7 during structured covering of the conductive layer 4, as described in process step ii, with the covering layer D 5. The curve 30 represents the surface resistance at various temperatures in the regions which have not been etched in process step ii, that is to say the covered regions $D_d$ 6. It can be seen that the etched regions have a significantly higher surface resistance the higher the temperature selected in the etching process. In contrast, the temperature of the etching process has scarcely any to no influence on the surface resistance of the covered regions. The surface resistance of these regions remains at 180 ohm/square.

Test Methods

Unless stated otherwise, the test methods and the Examples are carried out under standard conditions. Unless stated otherwise, % ranges are % by weight ranges.

Determination of the Surface Resistance

For determination of the surface resistance, Ag electrodes of 2.5 cm length are vapour-deposited via a shadow mask such that a resistance measurement is possible in each of the areas A and B. The surface resistance is determined with an electrometer (Keithly 614). The determination was carried out by means of the so-called "four point probe" measurement as is described, for example, in U.S. Pat. No. 6,943,571 B1.

Determination of the Colour Values L, a and b and the Transmission

The procedure for measurement of the transmission spectra of coated PET films is in accordance with ASTM 308-94a. For this, a 2-channel photospectrometer from Perkin Elmer, type Lambda 900 is used. The apparatus is equipped with a 15 cm photometer sphere. Proper functioning of the photospectrometer is ensured by regular checking of the wavelength calibration and the linearity of the detector in accordance with the manufacturer's recommendations and is documented.

For the transmission measurement, the film to be measured is fixed in front of the entry opening of the photometer sphere with the aid of a press-on holder, so that the measuring beam penetrates through the film without shadowing. The film is visually homogeneous in the region of the penetrating measuring beam. The film is orientated with the coated side towards the sphere. The transmission spectrum is recorded in the wavelength range of 320-780 nm in wavelength increments of 5 nm. In this context, there is no sample in the reference beam path, so that measurement is against air.

For evaluation of the colour of the transmission spectrum the "WinCol—version 1.2" software provided by the manufacturer of the apparatus is used. In this context, the CIE tristimulus values (standard colour values) X, Y and Z of the transmission spectrum in the wavelength range of 380-780 nm are calculated in accordance with ASTM 308-94a and DIN 5033. From the standard colour values, the standard colour value contents x and y and CIELAB coordinates L*, a* and b* are calculated in accordance with ASTM 308-94a and DIN 5033.

Climate Test

The layered body is stored at 85 C and 85% relative atmospheric humidity. The colour values L, a and b are measured beforehand and afterwards.

EXAMPLES

Example 1

Structuring of Conductive Layers by Means of a Polymer Coating and Subsequent Etching Process Preparation of the Solutions/Formulations Polymer P1

Clevios® FE-T (PEDOT/PSS dispersion obtainable from Heraeus Clevios GmbH) is used as composition Z2.

Polymer P2

20 g of Belland Polymer 88140 (butyl acrylate/methacrylic acid/styrene copolymer obtainable from Belland AG) are dissolved in 80 g of a solvent mixture (methyl ethyl ketone—ethanol in a volume ratio of 1:4) at room temperature (approx. 22° C.), while stirring, until a glass-clear solution is obtained.

Alkaline Aqueous Solution

A 25 wt. % strength aqueous ammonia solution is diluted with water until a pH of this solution in the range of 10-12 is reached.

Sulphuric Acid Solution

An approx. 1 wt. % strength solution in water is prepared.

Composition Z1

10 g of sodium dichlorodiisocyanurate dihydrate are dissolved in 90 g of water at room temperature (approx. 22° C.), while stirring. This stock solution was diluted with water to a sodium dichlorodiisocyanurate dihydrate content of 10 wt. % and 5 wt. % respectively.

Example 1 (FIG. 3)

A conductive PEDOT/PSS layer is coated from the Clevios® FE-T dispersion on to a polyester film from DuPont Teijin—type Melinex 505—by means of a bar coater. The wet film thickness is in the range of 4-12 μm. Drying is carried out at 130° C. for 5 minutes. The surface resistance at a dry film thickness of 12 μm is approx. 200 ohm/sq.

The polymer P2 solution is printed on (wet film thickness 4-6 μm) in a structured form by means of a colour proofer (type CP90-200 from Saueressig). A cylinder which was likewise manufactured by Saueressig is used for this. The printed film is dried at 70° C. in an oven for 5 minutes.

The film obtained after the drying is immersed for 60 s in the 10 wt. % sodium dichlorodiisocyanurate dihydrate solution. This process is followed by washing under running water for 10 s.

The film thereby obtained is immersed in an aqueous 1.25 wt. % ammonia solution for 2 minutes until the layer of Belland Polymer 88140 is removed. After washing with water and drying at 70° C. in an oven, the surface resistance is reduced by a treatment in the sulphuric acid solution.

After these steps the film has a surface resistance of $>10^9$ ohm/square on the etched (not covered with Belland Polymer 88140) places and of the starting value on the non-etched (covered with Belland Polymer 88140) places.

No contrast differences are to be detected after a climate test of 1,000 h. (FIG. 4 and Table 1)

Example 2

The procedure is as in Example 1, with the difference that a 5 wt. % sodium dichlorodiisocyanurate dihydrate solution was employed.

Comparison Example

The same process as described above is carried out, with the difference that instead of a sodium dichlorodiisocyanurate dihydrate solution, a 15 wt. % aqueous cerium nitrate solution is employed. The L, a and b values of the respective etched and non-etched regions before and after the climate test show differences in colour compared with the layered body according to the invention (Table 1).
Measurement of the Colour Number of PEDOT/PSS Layers Before and after the Climate Test The colour position was determined in the L*a*b* coordinate system. "Non-etched" means that the particular region was not treated with the sodium dichlorodiisocyanurate dihydrate solution or with the cerium nitrate solution (corresponds to the covered region $D_d$). "Etched" means that the particular region was treated with the sodium dichlorodiisocyanurate dihydrate solution or with the cerium nitrate solution (corresponds to the non-covered region $D_u$).

dryer, as in this example. This process was followed by washing under running, preferably distilled water for 10 s.

The film obtained by this procedure was treated for 15 seconds in an ultrasound bath which contained ethanol, until the layer of the polymer P2 of Belland Polymer 88140 was removed. After washing with water and drying at 70° C., the film could be used.

After these steps the film had a surface resistance of $>10^{10}$ ohm/square on the etched (not covered with Belland Polymer 88140) regions $D_u$ and a surface resistance with the starting value of approx. 180 ohm/square on the non-etched (covered with Belland Polymer 88140) regions $D_d$.

Example 4

The procedure was as in Example 3, with the difference that a film A made of PET was used as the substrate, which was coated with a formulation which had a higher degree of crosslinking than the polyester film of DuPont (type Melinex 505).

By the original dipping process in the 10 wt. % strength sodium dichlorodiisocyanurate dihydrate solution, as described in Example 1 and 2, in which no hot-plate was used, 20 minutes were required in order to destroy the conductivity. With the process which is carried out at a higher temperature, as described in Example 3 and 4, a value of $10^{10}$ ohm/square can be measured after 30 seconds. It can

|    | Example 1 | | | | Example 2 | | | | Comparison example | | | |
|    | Non-etched | | Etched | | Non-etched | | Etched | | Non-etched | | Etched | |
|    | 0 h | 1,000 h | 0 h | 1,000 h | 0 h | 1,000 h | 0 h | 1,000 h | 0 h | 1,000 h | 0 h | 1,000 h |
| a* | −0.89 | −0.28 | −0.96 | 0.38 | −0.6 | −0.24 | −0.66 | −0.19 | −1.27 | −0.19 | −1.21 | −0.18 |
| b* | −0.66 | −0.21 | −1.13 | −0.46 | −0.95 | −0.14 | −1.46 | 0.01 | 0.52 | −0.09 | −0.77 | 0.26 |
| L* | 94.77 | 93.47 | 95.28 | 94.93 | 94.69 | 93.58 | 95.21 | 93.19 | 96.74 | 93.61 | 95.24 | 93.29 |

Differences scarcely perceptible with the eye result in the colour position in the examples according to the invention.

Example 3 (FIG. 5b)

An electrically conductive layer 4 in the form of a PEDOT/PSS layer was coated from the Clevios® FE-T dispersion on to a substrate 3 consisting of a polyester film from DuPont Teijin—type Melinex 505—by means of a bar coater. The wet film thickness was in the range of 4-12 μm. Drying was carried out at 130° C. for 5 minutes. The surface resistance at a dry film thickness of 12 μm was approx. 180 ohm/sq.

The polymer P2 solution (Belland Polymer 88140) was printed on in a structured form by means of a colour proofer (type CP90-200 from Saueressig), so that regions covered with Belland and regions not covered with Belland were formed. A wet film thickness in a range of from 4 to 6 μm was obtained in this way. A cylinder which was likewise manufactured by Saueressig was used for this. The printed film was dried at 70° C. in an oven for 5 minutes.

The film obtained after the drying is laid under paper 10 (for example, as here, a Whatmann 602 filter paper) which was impregnated with a 10 wt. % strength sodium dichlorodiisocyanurate dihydrate solution 18. This step is also call an etching step. The film was treated at 60° C. for 15 seconds over a water bath or a hot-plate 11, for example a photo be seen from FIG. 7 that the surface resistance of the etched regions of a layered body such as is obtained under Example 3 increases greatly from a treatment temperature of 20 degrees Celsius.

Example 5

The procedure was as in Example 3, with the difference that a film A made of PET was used as substrate, which was coated with a formulation which had a higher degree of crosslinking than the Clevios® FET (commercially available by Heraeus Precious Metals GmbH & Co. KG, Deutschland (Germany)).

By the original dipping process in the 10 wt. % strength sodium dichlorodiisocyanurate dihydrate solution, as described in Example 1 and 2, in which no hot-plate was used, 20 minutes were required in order to destroy the conductivity. With the process which is carried out at a higher temperature, as described in Example 3, 4 and 5, a value of $10^{10}$ ohm/square can be measured after 30 seconds. It can be seen from FIG. 7 that the surface resistance of the etched regions of a layered body such as is obtained under Example 3 increases greatly from a treatment temperature of 20 degrees Celsius.

The invention claimed is:

1. A process for the production of a layered body S2, comprising the process steps:
   i) provision of a layered body S1 comprising a substrate and an electrically conductive layer which is applied to the substrate and comprises an electrically conductive polymer P1;
   ii) partial covering of a part of the electrically conductive layer with a covering layer D, comprising a polymer P2 from a covering phase to obtain at least one covered region $D_d$ and at least one non-covered region $D_u$ of the electrically conductive layer;
      wherein polymer P2 is a copolymer consisting of methacrylic acid, butyl acrylate and styrene recurring units, and wherein covering layer D is obtained by a process comprising the process steps:
      iia) application of a covering phase consisting of:
         10 wt. % to approximately 100 wt. %, based on the total weight of the covering phase, of polymer P2;
         less than 1 wt. %, based on the total weight of the covering phase, of impurities from a preparation process of polymer P2 selected from the group consisting of residual monomers, catalysts and salts thereof;
         0.05 wt. % to 15 wt. %, based on the total weight of the covering phase, of additives selected from the group consisting of surfactants, stabilizers, plasticizers, tackifiers, impact modifiers, viscosity modifiers, defoamers, and adhesion promoters; and
         optionally a solvent,
         to a part of the electrically conductive layer as a pattern, the covered and the non-covered regions $D_d$ and $D_u$ resulting from the pattern; and
      iib) optionally at least partial removal of the solvent to obtain the covering layer D;
   iii) reduction of the electrical conductivity of the electrically conductive layer in at least a part of the at least one non-covered region $D_u$ compared with the electrical conductivity of the electrically conductive layer in the at least one covered region $D_d$; and
   iv) at least partial removal of the covering layer D by an alkaline aqueous treatment.

2. The process according to claim 1, wherein process step iii) includes at least a bringing of at least a part of the at least one non-covered region $D_u$ into contact with a composition Z1 comprising an organic compound which is capable of releasing chlorine, bromine or iodine.

3. The process according to claim 2, wherein the composition Z1 employed in process step iii) comprises cyanuric acid as a further component.

4. The process according to claim 2, wherein the bringing of at least a part of at least one non-covered region $D_u$ into contact with the composition Z1 is carried out by immersion of the electrically conductive layer in the composition Z1 or by printing the electrically conductive layer with the composition Z1.

5. The process according to claim 4, wherein a colour separation ΔE before, after of at most 4.5 results from the bringing of the electrically conductive layer into contact with the composition Z1.

6. The process according to claim 4, wherein the bringing of the electrically conductive layer into contact with the composition Z1 is carried out under conditions such that the thickness of the electrically conductive layer in those regions which are brought into contact with the composition Z1 is reduced by at most 50%.

7. The process according to claim 1, wherein at least a part of the layered body is heated before, after or during one or more of the process steps ii to iv.

8. The process according to claim 1, wherein in process step iv) the removal of the covering layer D is carried out by bringing at least a part of the covering layer D into contact with a solution having a pH in the range of from 8 to 14.

9. The process according to claim 1, wherein the covering phase is a solution or dispersion which includes the solvent.

10. The process according to claim 9, wherein the solvent is chosen from the group consisting of water, alcohols, ketones, esters and a mixture of two or more of these.

11. The process according to claim 1, wherein in process step ii) the covering layer D is applied by means of a printing process.

12. The process according to claim 1, wherein in process step iii) the electrical conductivity of the electrically conductive layer in at least a part of the at least one non-covered region $D_u$ is reduced by a factor of at least 10 compared with the electrical conductivity of the electrically conductive layer in the at least one covered region $D_d$.

13. The process according to claim 1, wherein the electrically conductive layer comprises a polyanion in addition to the electrically conductive polymer.

14. The process according to claim 1, wherein the electrically conductive layer comprises complexes of poly(3,4-ethylenedioxythiophene) and polystyrenesulphonic acid.

15. The process according to claim 1, wherein the layered body S1 is obtainable by a process comprising the process steps:
   ia) provision of the substrate;
   ib) application of a composition Z2 comprising the electrically conductive polymer P1 and a solvent to at least a part of the surface of the substrate; and
   ic) at least partial removal of the solvent to obtain the electrically conductive layer.

16. The process according to claim 15, wherein the composition Z2 is a solution or dispersion comprising complexes of poly(3,4-ethylenedioxythiophene) and polystyrenesulphonic acid.

17. The process according to claim 1, furthermore comprising a process step
   v) treatment of the layered body S2 with a solution having a pH of <7.

18. The process according to claim 1, wherein the covering phase consists of
   20 to 90 wt. %, based on the total weight of the covering phase, of polymer P2,
   less than 1 wt. %, based on the total weight of the covering phase, of the impurities,
   0.5 to 5 wt. %, based on the total weight of the covering phase, of the additives, and
   the solvent.

* * * * *